(12) United States Patent
Gharia

(10) Patent No.: US 6,845,026 B1
(45) Date of Patent: Jan. 18, 2005

(54) THYRISTOR-BASED CONTENT ADDRESSABLE MEMORY (CAM) CELLS

(75) Inventor: Nilesh A. Gharia, San Jose, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/452,216

(22) Filed: May 30, 2003

(51) Int. Cl.[7] .................. G11C 15/00; G11C 11/00; G11C 11/34; G11C 7/00; G06F 12/00

(52) U.S. Cl. .................. 365/49; 365/159; 365/180; 365/189.11; 711/108

(58) Field of Search .................. 365/49, 159, 180, 365/189.11; 711/108

(56) References Cited

U.S. PATENT DOCUMENTS

| | | | |
|---|---|---|---|
| 5,600,160 A | 2/1997 | Hvistendahl | 257/288 |
| 6,104,045 A | 8/2000 | Forbes et al. | 257/141 |
| 6,229,161 B1 | 5/2001 | Nemati et al. | 257/133 |
| 6,448,586 B1 | 9/2002 | Nemati et al. | 257/133 |
| 6,462,359 B1 | 10/2002 | Nemati et al. | 257/107 |
| 6,528,356 B2 | 3/2003 | Nemati et al. | 438/135 |
| 6,552,398 B2 * | 4/2003 | Hsu et al. | 257/350 |
| 2004/0056270 A1 * | 3/2004 | Hsu et al. | 257/133 |
| 2004/0156233 A1 * | 8/2004 | Bhattacharyya | 365/176 |

* cited by examiner

*Primary Examiner*—David Nelms
*Assistant Examiner*—Ly Duy Pham
(74) *Attorney, Agent, or Firm*—Shemwell Gregory & Courtney LLP

(57) ABSTRACT

A content addressable memory (CAM) cell includes a memory cell storing data values. The memory cell includes a surrounding-gate thyristor and an access transistor. The CAM cell also includes a compare circuit coupled among the memory cell and a match line. The compare circuit receives data and comparand data and affects a logical state of a match line in response to a predetermined relationship between the data and comparand data. The compare circuit includes a first transistor set coupled for conduction state control by signals representative of the data, and a second transistor set coupled for conduction state control by signals representative of the comparand data.

35 Claims, 23 Drawing Sheets

US 6,845,026 B1

THYRISTOR-BASED CONTENT ADDRESSABLE MEMORY (CAM) CELLS

TECHNICAL FIELD

The disclosed embodiments relate generally to content addressable memory (CAM) cells.

BACKGROUND

A content addressable memory (CAM) device is a storage device that is particularly suitable for matching functions because it can be instructed to compare a specific pattern of comparand data with data stored in an associative CAM array. A CAM, also referred to as an associative memory, can include a number of data storage locations, each of which can be accessed by a corresponding address. Functionality of a CAM depends at least in part on whether the CAM includes binary or ternary CAM cells.

Typical binary CAM cells are able to store to states of information, a logic one state and a logic zero state. Binary CAM cells typically include a memory cell and a compare circuit. The compare circuit compares the comparand data with data stored in the memory cell and provides the match result to a match line. Columns of binary CAM cells may be globally masked by mask data stored in one or more global mask registers.

Ternary CAM cells are mask-per-bit CAM cells that effectively store three states of information, namely a logic one state, a logic zero state, and a don't care state for compare operations. Ternary CAM cells typically include a second memory cell that stores local mask data for the each ternary CAM cell. The local mask data masks the comparison result of the comparand data with the data stored in the first memory cell such that, when the mask bit has a first predetermined value (a logic low, for example) its compare operation will be masked so that the comparison result does not affect the match line (e.g., always appears to match). The ternary CAM cell offers more flexibility to the user to determine on an entry-per-entry basis which bits in a word will be masked during a compare operation.

Conventional CAM devices have used a variety of volatile or nonvolatile Random Access Memory (RAM) devices, such as static random access memory (SRAM) devices and dynamic random access memory (DRAM) devices. The SRAM devices have generally been used in applications involving a high random access speed and/or a CMOS logic compatible process, while the DRAM devices have been used in high-density applications where the relatively slower random access speed of DRAM can be tolerated.

More recently, a RAM device based on Negative Differential Resistance (NDR) devices has been introduced. These NDR-based RAM devices typically include at least two active elements, including an NDR device. The NDR device can be any one of a variety of NDR devices ranging from a simple bipolar transistor to more complicated quantum-effect devices. The NDR-based RAM device supports a cell area smaller than conventional RAM cells because of the smaller number of active devices and interconnections. The NDR-based RAM cells, however, can introduce issues that have affected widespread commercial adaptation in RAM products. As an example, some NDR-based RAM cells have high standby power consumption due to the large current needed in one or both of the stable states of the cell. As a further example, some NDR-based RAM cells also introduce limitations in access speed due to slow switching from one state to the other.

An NDR-based RAM device has been recently introduced that potentially provides the speed of conventional SRAM devices at the density of Dynamic Random Access Memory (DRAM) devices in a CMOS compatible process. This RAM device uses a capacitively-coupled thyristor as the NDR device to form a bistable element for the RAM device. While many typical CAM devices used static memory technology, dynamic memory technology including DRAM devices was also used because it provided relatively denser and, therefore, larger memory arrays on the same size chip as similar arrays using static memory technology. The efficient search capabilities of CAM devices have proven useful in many applications including address filtering and lookups in routers and networking equipment, for example, and pattern recognition for encryption and/or decryption and compression and/or decompression applications, for example, as well as other pattern recognition applications. As the applications for CAM devices increase so to do the applications for denser RAM-based CAM cells.

Figure 1:
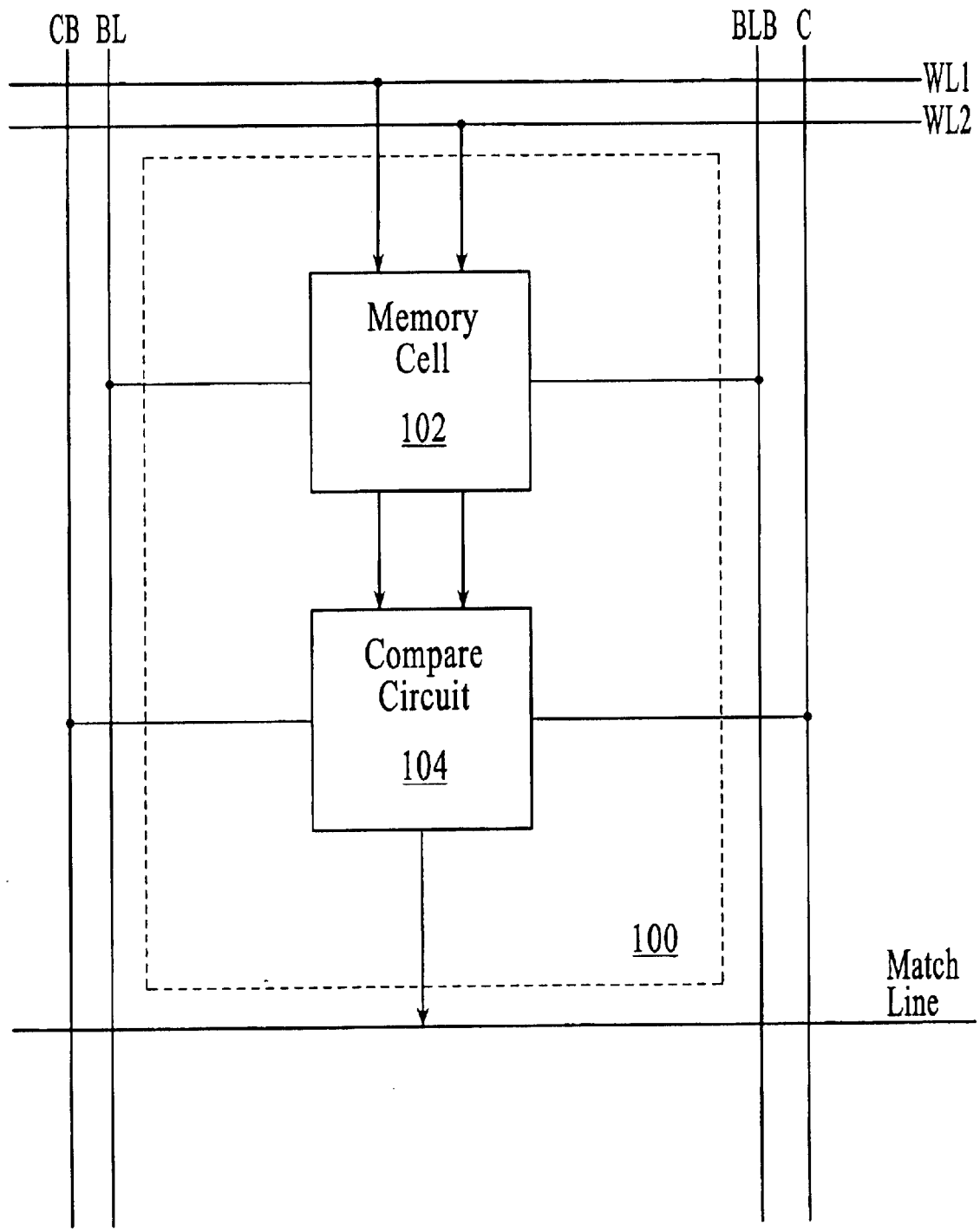
FIG. 1 is a block diagram of a binary CAM cell that includes a thyristor-based memory cell, under an embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 104 is first introduced and discussed with respect to FIG. 1). Any modifications necessary to the Figures can be readily made by one skilled in the relevant art based on the detailed description provided herein.

DETAILED DESCRIPTION

In the following description, for purposes of explanation, specific nomenclature is set forth and specific details are introduced to provide a thorough understanding of, and enabling description for, embodiments of the present invention. One skilled in the relevant art, however, will recognize that the present invention can be practiced without one or more of these specific details, or with other components, systems, etc. In other instances, well-known circuits, devices, structures or operations are not shown, or are not described in detail, to avoid obscuring aspects of the invention. Additionally, the interconnection between circuit elements or blocks may be shown as buses or as single signal lines. Each of the buses may alternatively be single signal lines, and each of the single signal lines may alternatively be buses. Additionally, the suffix "B" attached to signal names indicates that the signal is an active low signal. Each of the active low signals may be changed to active high signals as generally known in the art. Furthermore, the transistors of an embodiment are symmetrical devices so references to "source (drain)" and "drain (source)" are made to indicate the symmetrical nature of these couplings. Other modifications and changes to the exemplary embodiments and applications below include, but are not limited to: altering the shapes, locations, and sizes of device gates; adding structures to the capacitively-coupled NDR device; increasing the number of p-n regions in the current-switching device; and interchanging p- and n-type regions in the device structures and/or using PMOS devices rather than NMOS devices and NMOS devices rather than PMOS devices.

FIG. 1 is a block diagram of a binary CAM cell 100 that includes a thyristor-based memory cell 102, under an embodiment, and a compare circuit 104. Memory cell 102 stores data to be compared with comparand data provided on compare signal lines C and CB. The memory cell 102 is a thyristor-based SRAM cell, but alternative embodiments may include any type of memory storage element, including volatile or nonvolatile memory storage elements. Data is written to and read from the memory cell 102 via data bit lines BL and BLB when word lines WL1 and WL2 are asserted to a predetermined logic state. Alternative embodiments may write data to or read data from the memory cell 102 using any number/combination of bit lines or other data or bus lines.

Compare circuit 104 compares the data stored in the memory cell 102 with comparand data provided on compare signal lines C and CB. Compare circuit 104 includes transistors coupled to perform the comparison function. The transistors of compare circuit 104 include n-channel or NMOS transistors and/or combinations of NMOS and p-channel or PMOS transistors coupled in any number of configurations known in the art, some of which are described below, but the embodiment is not so limited.

The match line couples the binary CAM cell 100 of an embodiment to a number of other CAM cells (not shown) to form a row of a CAM device. Furthermore, the match line couples the CAM cells of the row, including binary CAM cell 100, to a pre-charge circuit (not shown). The pre-charge circuit initially pre-charges the match line to a pre-specified logic state or level. As an example, the pre-charge circuit of an embodiment pre-charges the match line to a logic one state. If there is a match, the match line remains pre-charged to the logic one state. If there is a mismatch, however, compare circuit 104 couples the match line for discharge to a logic zero state.

The match line also couples the CAM cells of a row, including binary CAM cell 100, to an encoder (e.g., a priority encoder) that is not shown. The priority encoder of an embodiment determines the address, location or index of the highest priority matching entry in the CAM array, but is not so limited.

Figure 2:
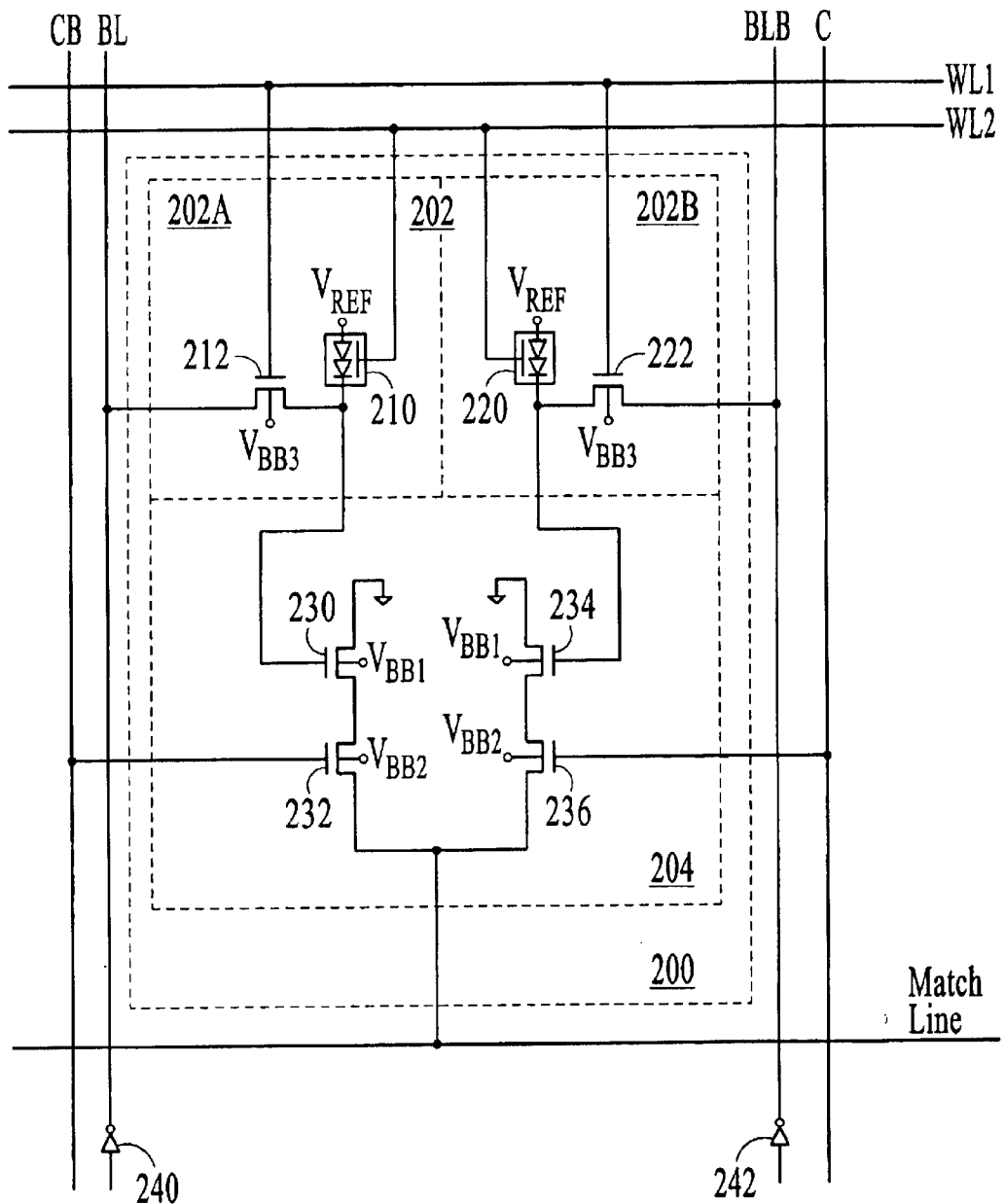
FIG. 2 is a block diagram of a binary CAM cell that includes a thyristor-based memory cell and a four-transistor compare circuit, under the embodiment of FIG. 1.

FIG. 2 is a block diagram of a binary CAM cell 200 that includes a thyristor-based memory cell 202 and a four-transistor compare circuit 204, under the embodiment of FIG. 1. The compare circuit 204 is an exemplary embodiment of a compare circuit, but is not so limited as many alternative embodiments exist for this circuit. A match line couples the binary CAM cell 200 of an embodiment to a number of other CAM cells (not shown) to form a row of a CAM device.

Memory cell 202 is a thyristor-based memory cell including two storage devices or cells 202A and 202B. The first cell 202A includes thyristor 210 and access transistor 212.

The thyristor 210 of an embodiment is a capacitively-coupled NDR device with a vertical-surrounding gate, as described further below. The anode of thyristor 210 is coupled to a reference voltage $V_{REF}$. The reference voltage $V_{REF}$ of an embodiment is approximately one (1) volt, but is not so limited. The cathode of thyristor 210 is coupled to the gate of n-channel transistor 230 of the compare circuit 204, but alternative embodiments can use various other types of transistors. The surrounding gate of thyristor 210 is coupled to word line WL2.

The access transistor 212 couples thyristor 210 to data bit line BL. The source (drain) of access transistor 212 is coupled to data bit line BL, while the drain (source) of access transistor 212 is coupled to the cathode of thyristor 210. The gate of access transistor 212 is coupled to word line WL1. The writing of data to and the reading of data from the first cell 202A is performed by charge transfer through the bit line BL and access transistor 212 in response to the logical state of the word line WL1 in combination with charge transfer through the thyristor 210 in response to the logical state of word line WL2, as described further below. The data bit line BL includes an inverter 240, but is not so limited.

The second cell 202B includes thyristor 220 and access transistor 222. The thyristor 220 of an embodiment is a capacitively-coupled NDR device with a vertical-surrounding gate. The anode of thyristor 220 is coupled to a reference voltage $V_{REF}$, where the reference voltage $V_{REF}$ is approximately one (1) volt, but is not so limited. The cathode of thyristor 220 is coupled to the gate of n-channel transistor 234 of the compare circuit 204, but alternative embodiments can use various other types of transistors. The surrounding gate of thyristor 220 is coupled to word line WL2.

The access transistor 222 couples thyristor 220 to data bit line BLB. The source (drain) of access transistor 222 is coupled to data bit line BLB, while the drain (source) of access transistor 222 is coupled to the cathode of thyristor 220. The gate of access transistor 222 is coupled to word line WL1. The writing of data to and the reading of data from the second SRAM cell 202B is performed by charge transfer through the bit line BLB and access transistor 222 in response to the logical state of the word line WL1 in combination with charge transfer through the thyristor 220 in response to the logical state of word line WL2. The data bit line BLB includes an inverter 242, but is not so limited.

Compare circuit 204 compares the data stored in the memory cell 202 with comparand data provided on compare signal lines C and CB. Compare circuit 204 includes transistors 230, 232, 234, and 236 coupled to perform the comparison function. In the compare circuit of an embodiment, transistors 230, 232, 234, and 236 are n-channel transistors, but the embodiment is not so limited. Transistors 230 and 232 are coupled in series to form a first path of the compare circuit 204, and transistors 234 and 236 are coupled in series to form a second path of the compare circuit. The sources (drains) of transistors 232 and 236 are coupled to the match line, while the drains (sources) of transistors 230 and 234 are coupled to ground potential.

Regarding control inputs to each of the transistors 230–236, the gates of transistors 230 and 234 are coupled to receive data from the first and second cells 202A and 202B of the memory cell 202, respectively. The gate of transistor 232 receives comparand data from compare signal line CB and the gate of transistor 236 receives comparand data from compare signal line C. The sources (drains) of transistors 232 and 236 are coupled to the match line. Compare circuit 204 pulls the pre-charged match line to a logic zero state when the comparand data does not match (i.e., mismatches) the data stored in the memory cell 202, but the embodiment is not so limited.

Figure 3:
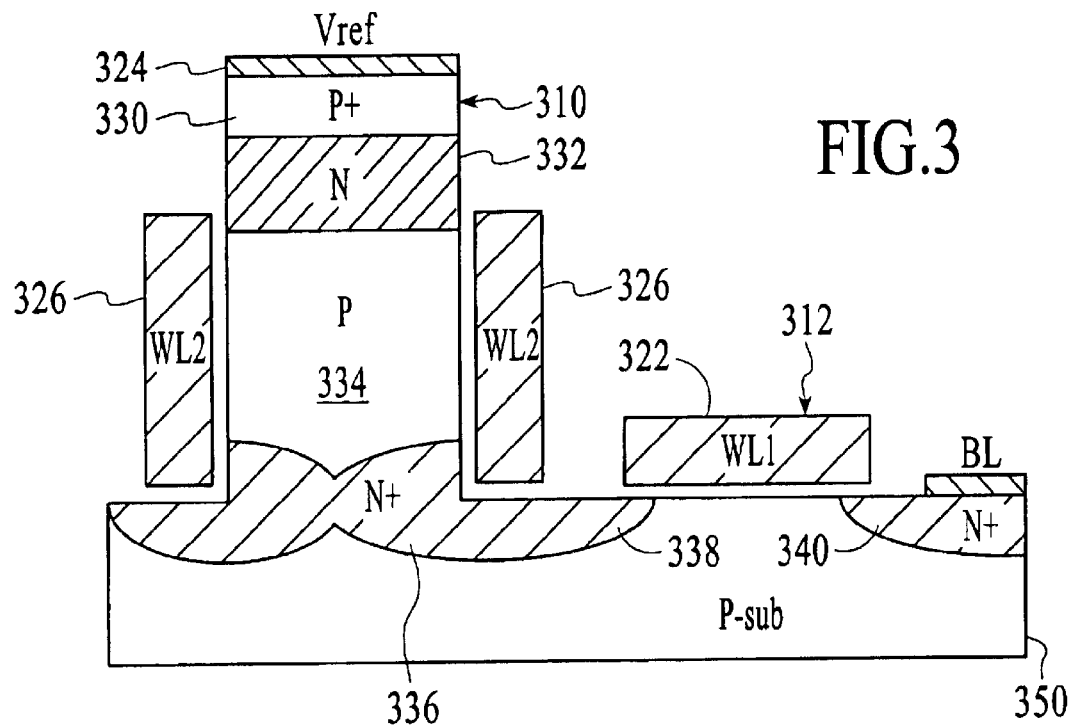
FIG. 3 is a block diagram of a semiconductor structure of a thyristor-based SRAM storage cell, under an embodiment of FIG. 2.

The cells 202A and 202B, as described above, each include an NDR device in the form of a thyristor 210 and 220 that functions in combination with an access transistor 212 and 222, respectively, to store data. FIG. 3 is a block diagram of a semiconductor structure of a thyristor-based storage cell 202A, under an embodiment of FIG. 2. While a description of storage cell 202A follows in detail, the description applies to any storage cell depicted herein.

Referring to FIG. 2 and FIG. 3, the cell 202A includes a PNPN-type NDR device 310 and a planar n-channel or NMOS access transistor 312, which can alternatively be referred to as a pass transistor 312. The access transistor 312 includes a gate 322 along with drain (source) 338 and source (drain) 340 regions of n+-type material in a p-type substrate 350. The gate 322 forms part of or couples to the first word line WL1, while one of either the n+drain (source) or source (drain) regions couples to the bit line BL.

The NDR device 310 of an embodiment is defined vertically on top of a portion of the access transistor 312, for example over whichever of the drain (source) 338 or source (drain) 340 region of the access transistor 312 is not coupled to the bit line BL. The stacking of the NDR device 310 in the drain (source) area supports smaller cell areas and, therefore, higher density SRAMs, where SRAM densities approach those of DRAM-based devices. In an alternative embodiment, the NDR device 310 is fabricated adjacent to the access transistor 312.

The NDR device includes, but is not limited to, a metallic layer that forms the anode 324 of the NDR device 310. The anode 324 is used to couple the NDR device 310 to a supply or reference voltage $V_{REF}$. The anode 324 is coupled to a top region of p+-type material 330 that is adjacent to a top region of n-type material 332. The top region of n-type material 332 is adjacent to a central region of p-type material 334. The central region of p-type material 334 is adjacent to a lower region of n+-type material 336, referred to herein as the cathode 336.

The central region of p-type material 334 is adjacent to and surrounded by a charge plate, or gate-like device 326, but the embodiment is not so limited. The gate 326 overlaps the lower region of n+-type material 336 but not the top region of n-type material 332, but is not necessarily so limited. The NDR device 310 is sufficiently thin so that the gate 326 of an embodiment has tight control on the potential of the central region of p-type material 334, and this potential can be modulated by the capacitive coupling via the gate 326.

The WL2 signals are used for write operations and, more particularly, to increase the speed of switching the NDR device 310 to the OFF state when writing a logic zero to the cell, and to switch the NDR device 310 to the ON state with low voltages when writing a logic one to the cell. As such, the gate 326, which forms part of or capacitively couples to the word line WL2, is used to enhance switching of the NDR device 310 between two stable states by increasing the switching speed of the current between the anode 324 and the cathode 336.

In operation, the NDR device 310 has two stable states referred to herein as the OFF state and the ON state. The OFF state is a state in which the NDR device 310 is reversed bias and in a current-blocking mode, and the voltage of the cathode 336 is at its logic low level (approximately one (1) volt). The ON state is a state in which the NDR device 310 is forward biased and in a current-passing mode. The voltage of the cathode 336 is at its logic high level (approximately 0.4 to 0.5 volts) when the NDR device 310 is in the ON state.

The state of the NDR device 310 is maintained by maintaining the voltage on the cathode 336 at a level appropriate to the NDR device 310 state. In an embodiment, the cathode voltage is maintained at the appropriate level by the holding current of the NDR device 310, where the holding current of the NDR device 310 is provided by the subthreshold current of the access transistor 312. Consequently, the access transistor 312 is biased using a bulk or substrate bias of the p-type substrate 350 to control the threshold voltage of the access transistor 312 such that the subthreshold current of the access transistor 312 provides the appropriate holding current of the NDR device 310.

Returning to FIG. 2, the substrate of the access transistor 212 is biased using a bulk bias $V_{BB3}$ to control the threshold voltage of the access transistor 212 such that the subthreshold current of the access transistor 212 provides the holding current of the NDR device 210. In an embodiment, the bulk bias $V_{BB3}$ is at or below ground potential to support a holding current on the order of pico-amps per square micrometer of device area, but the embodiment is not so limited as these values can change with changes in device geometry.

Figure 4:
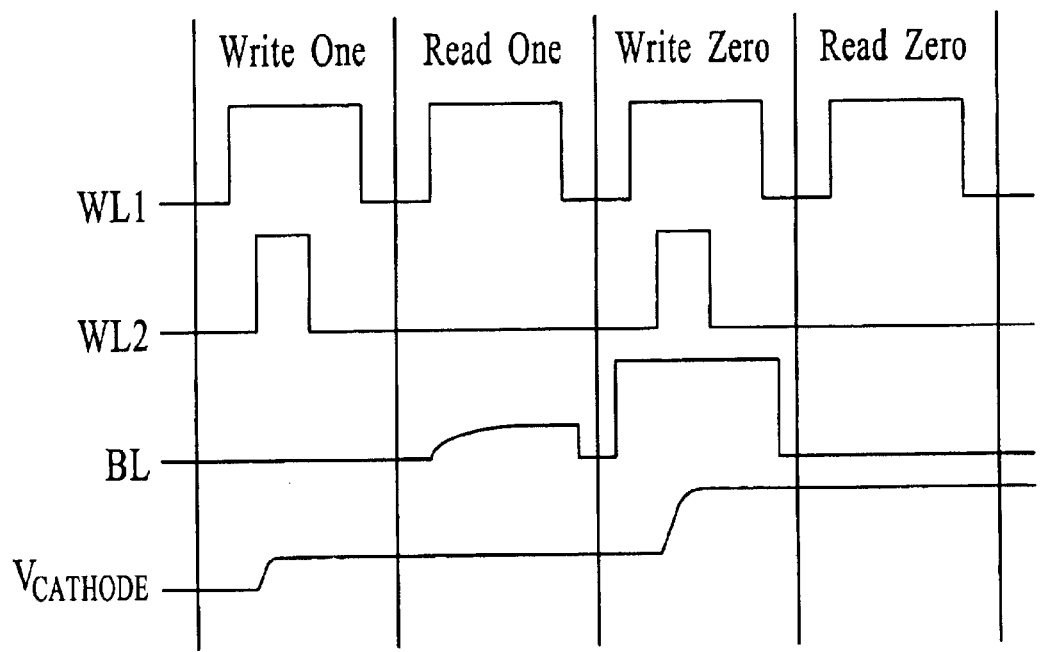
FIG. 4 is a timing diagram for various signals and nodes of the binary CAM cell, under the embodiments of FIG. 2 and FIG. 3.

FIG. 4 is a timing diagram 400 for various signals and nodes of the binary CAM cell, under the embodiments of FIG. 2 and FIG. 3. The timing diagram 400 shows signals for example read and write operations of the binary CAM cell, including Write One, Read One, Write Zero, and Read Zero operations. An example embodiment uses a reference voltage $V_{REF}$ of 1 volt, but is not so limited. In standby mode, the bit line BL and word line WL1 are held at zero volts and word line WL2 is held at a potential lower than ground potential. For the Read One and Read Zero operations, the WL1 signal is used to read the voltage of the cathode.

In a Write One operation, the bit line signal BL is held at a low logic level. After the WL1 signal is raised to a high logic level, a pulse is applied to word line WL2. With reference to FIG. 3, the rising edge of this pulse raises the potential of the central region of p-type material 334 via capacitive coupling and forward biases the junctions between the n-type region 332/p-type region 334 and the p-type region 334/n+-type region 336 which, in-turn, starts the regenerative process in the NDR device 310 and places the NDR device in the ON state. In the ON state, the voltage stored at the cathode is approximately 0.4 to 0.5 volts. Thus, a cathode voltage of approximately 0.4 to 0.5 volts results upon completion of a Write One operation.

For Write Zero operations, the bit line signal BL is raised to a high logic level, and then the word line WL1 is raised to a high logic level. This charges the cathode to the logic high state and moves the NDR device out of the strong forward biased region. A pulse is then applied to word line WL2. The capacitive coupling between the word line WL2 and the central region of p-type material results in an outflow of the minority charges from the central region of p-type material on the falling edge of the WL2 pulse, and reverse biases the junctions between the p-type region 334/n+-type region 336 and the n-type region 332/p-type region 334. The reverse biasing of the NDR device blocks current passage through the NDR device and places the NDR device in the OFF state. In the OFF state the voltage level at the cathode remains at approximately one (1) volt. Thus, a cathode voltage of approximately one (1) volt results upon completion of a Write Zero operation.

The truth table for the operation of binary CAM cell 200 is shown in Table 1.

TABLE 1

| C | CB | BL | BLB | Match Line |
|---|----|----|-----|------------|
| 0 | 1  | 0  | 1   | 1          |
| 0 | 1  | 1  | 0   | 0          |
| 1 | 0  | 0  | 1   | 0          |
| 1 | 0  | 1  | 0   | 1          |

With reference to the first row of the truth table of Table 1 and FIG. 2, the operation of binary CAM cell 200 is described. The logic one of the CB signal line causes transistor 232 to be in a conducting state. The logic zero of BL, when inverted via inverter 240, causes the BL signal line to carry a logic one. The logic one of the BL signal line corresponds to a Write One operation and a cathode voltage of approximately 0.4 to 0.5 volts (logic high) on the cathode of thyristor 210, as described above with reference to the Write One operation of the thyristor-based storage device. The cathode voltage of thyristor 210 causes transistor 230 to be in a non-conducting state, resulting in the absence of a conducting path between the match line and ground potential through the left path of the compare circuit 204.

The logic one of BLB, when inverted, causes the BLB signal line to carry a logic zero. The logic zero of the BLB signal line corresponds to a Write Zero operation and a cathode voltage of approximately one (I) volt (logic low) on the cathode of thyristor 220, as described above with reference to the Write Zero operation of the thyristor-based storage device. The cathode voltage of thyristor 220 causes transistor 234 to be in a conducting state. However, the logic zero of the C signal line causes transistor 236 to be in a non-conducting state, resulting in the absence of a conducting path between the match line and ground through the right path of the compare circuit 204. The absence of a conducting path through the compare circuit 204 causes the state of the match line to remain at the pre-charged level, logic one. The logic one state of the match line following the comparison indicates a match between the logic zero of BL and the logic zero of the comparand data on signal line C.

Continuing the example with reference to the second row of the truth table of Table 2, the logic one of BL, when inverted, causes the BL signal line to carry a logic zero. The logic zero of the BL signal line corresponds to a Write Zero and a cathode voltage of approximately one (1) volt (logic low) on the cathode of thyristor 210. The cathode voltage of approximately one (1) volt causes transistor 230 to be in a conducting state. Likewise, the logic one of the CB signal line causes transistor 232 to be in a conducting state. The result is a conducting path between the match line and ground potential through the left path of the compare circuit 204. The conducting path to ground allows the match line to discharge to a logic zero level from the pre-charged level, thereby indicating the absence of a match between the logic one of BL and the logic zero of the comparand data on signal line C.

Referring to the third row of the truth table of Table 2, the cathode of thyristor 210 has a voltage of approximately 0.4 to 0.5 volts as a result of the logic zero of BL. The logic zero of the CB signal line causes transistor 232 to be in a non-conducting state while the cathode voltage of thyristor 210 causes transistor 230 to also be in a non-conducting state, resulting in the absence of a conducting path between the match line and ground potential through the left path of the compare circuit 204.

The cathode of thyristor 220 has a voltage of approximately one (1) volt as a result of the logic one of BLB. The logic one of the C signal line causes transistor 236 to be in a conducting state while the cathode voltage of thyristor 220 causes transistor 234 to also be in a conducting state, resulting in a conducting path between the match line and ground through the right path of the compare circuit 2(04. The conducting path to ground allows the match line to discharge to a logic zero level from the pre-charged level. Thus, the logic zero state of the match line following the comparison indicates the absence of a match between the logic zero of BL and the logic one of the comparand data on signal line C.

Data of the fourth row of the truth table of Table 1 shows that the cathode voltage of thyristor 210 is approximately one (1) volt as a result of the logic one of BL. The cathode voltage of thyristor 210 results in transistor 230 being in a conducting state. However, the logic zero of the CB signal line causes transistor 232 to be in a non-conducting state. The result is a non-conducting path between the match line and ground potential through the left path of the compare circuit 204.

The cathode voltage of thyristor 220 is approximately 0.4 to 0.5 volts as a result of the logic zero of BLB. The logic one of the C signal line causes transistor 236 to be in a conducting state while the cathode voltage of thyristor 220 causes transistor 234 to be in a non-conducting state; the result is the absence of a conducting path between the match line and ground potential through the right path of the compare circuit 204. The absence of a conducting path through the compare circuit 304 causes the state of the match line to remain at the pre-charged level, logic one, indicating a match between the logic one of BL and the logic one of the comparand data on signal line C.

In the operation of binary CAM cell 200 during compare operations, the voltage at the cathode of the NDR devices 210 and 222 that corresponds to a Write One is approximately 0.4 to 0.5 volts, as described above. As the thyristor-based RAM cells are coupled to provide the cathode voltage to the gates of n-channel transistors 230 and 234, and as the cathode voltage of 0.4 to 0.5 volts is very near the typical threshold voltage of the n-channel transistors 230 and 234, it is possible for this cathode voltage to cause some conduction in the n-channel transistors when conduction is not desired. If this were to happen, for example, during the data conditions represented by the data of the fourth row of truth Table 2, it could result in a false mismatch indication by the compare circuit.

In evaluating the effects of a false mismatch, the data of the fourth row of the truth table of Table 2 is revisited. As described above, cell 202A is storing a voltage of approximately one (1) volt as a result of the logic one of BL, and the cathode voltage of the storage device 202A results in transistor 230 being in a conducting state. However, the logic zero of the CB signal line causes transistor 232 to be in a non-conducting state. The result is a non-conducting path between the match line and ground potential through the left path of the compare circuit 204.

The logic one of the C signal line causes transistor 236 to be in a conducting state. While the voltage of the storage device 202B (cathode voltage of approximately 0.4 to 0.5 volts) should cause transistor 234 to be in a non-conducting state, this example assumes that circumstances cause this cathode potential to be close enough to the threshold voltage of transistor 234 to cause conduction in transistor 234. The result is a conducting path between the match line and ground potential through the right path of the compare circuit 204. The conducting path to ground allows the match line to discharge, thereby providing a false indication of a mismatch between the logic one of BL and the logic one of the comparand data on signal line C.

The binary CAM cell of an embodiment prevents the false mismatch by maintaining a large enough differential between the threshold voltage and the gate voltage to prevent inadvertent or "false" conduction in a transistor that has its gate coupled to the cathode of an NDR device. The difference between the threshold voltage and the gate voltage is maintained in an embodiment by adjusting or offsetting the threshold voltage and/or the gate voltage of n-channel transistors that have gates coupled to the cathodes of the NDR devices. In particular, the threshold voltage and/or gate voltage is adjusted for n-channel transistors of the compare circuit, where the n-channel transistors have gates coupled to the cathodes of the NDR devices. The threshold voltage and/or gate voltage is also adjusted or offset for n-channel transistors of masking circuits having gates coupled to the cathodes of NDR device-based masking cells, but is not so limited.

One method for adjusting the difference between the threshold and gate voltages includes adjusting the threshold voltage of the appropriate n-channel transistors using a bulk or substrate bias voltage to increase the reverse bias voltage on the substrate, thereby increasing the magnitude of the threshold voltage. This increase in threshold voltage increases the difference between the gate voltage and the threshold voltage, thereby reducing the chance of a false mismatch.

With reference to FIG. 2, the binary CAM cell 200 includes bulk bias voltage $V_{BB1}$ to transistors 230 and 234. The bulk bias voltage $V_{BB1}$ is a negative potential that increases the magnitude of the threshold voltage of transistors 230 and 234 to a potential that is high enough to prevent inadvertent conduction in the corresponding transistor when the transistor gate is coupled to a voltage of approximately 0.4 to 0.5 volts. As an example appropriate to some device geometries, a bulk bias voltage $V_{BB1}$ of approximately −0.8 volts increases the magnitude of the threshold voltage of a typical n-channel transistor by approximately 0.2 volts. The bulk bias voltages $V_{BB2}$ and $V_{BB3}$ are at or below ground potential, but are not so limited.

Another method for adjusting the difference between the threshold and gate voltages includes adjusting the gate voltage applied to the n-channel transistors by adding an n-channel pass transistor to the coupling between the NDR device (cathode) and the gate of the corresponding n-channel transistor. The pass transistor subjects the cathode voltage to a voltage drop (appropriate to the type and biasing of the pass transistor) prior to applying the cathode voltage to the gate of the compare circuit transistor. This voltage drop reduces the applied gate voltage and thereby increases the difference between the threshold voltage of the compare circuit transistor and the cathode voltage, thus reducing the chance of a false mismatch. For example, when the cathode voltage is 0.5 volts, the voltage present at the gate of the compare circuit transistor following an n-channel pass transistor would be approximately zero (0) volts.

Figure 5:
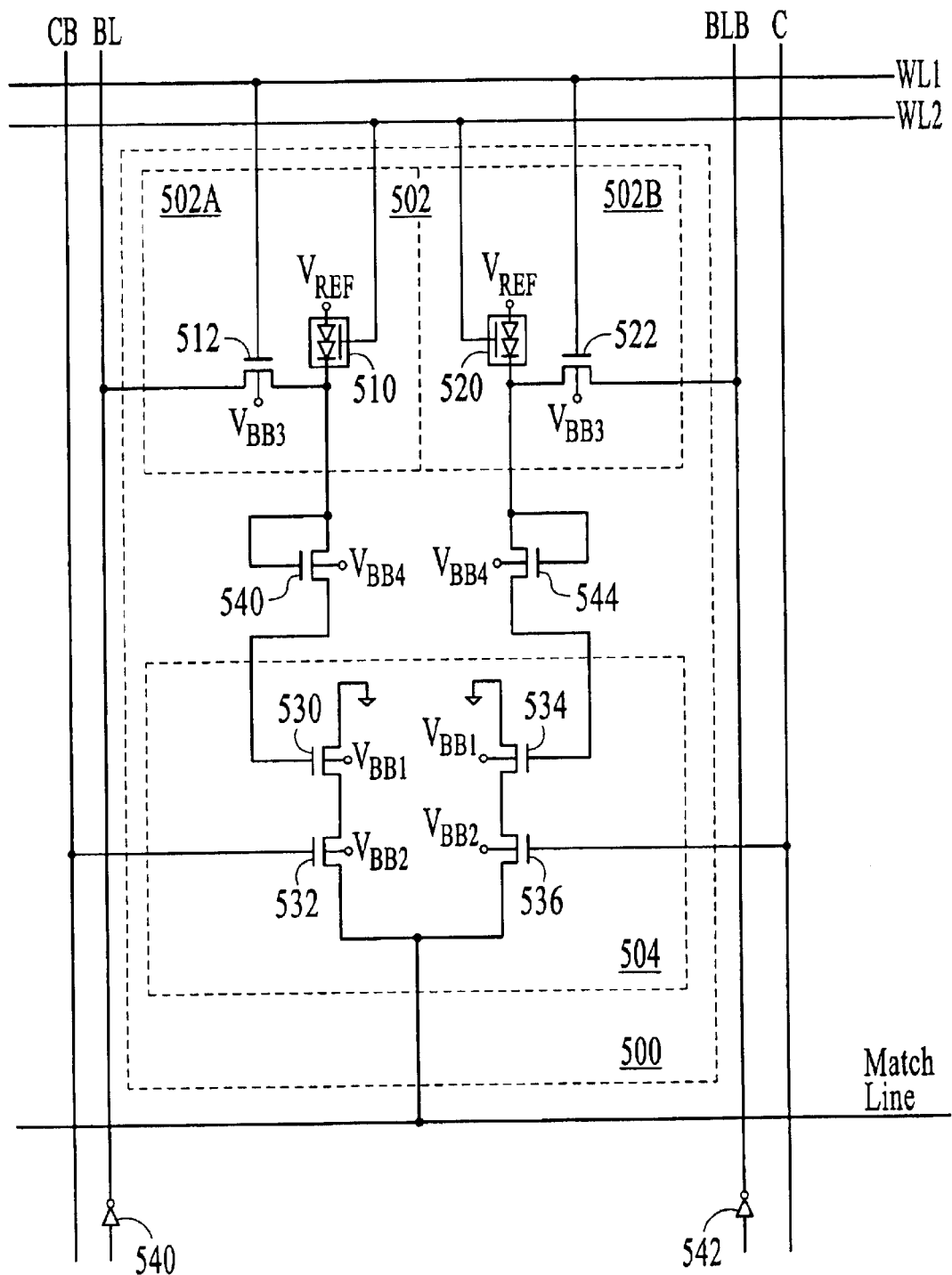
FIG. 5 is a block diagram of a binary CAM cell that includes a thyristor-based memory cell and a four-transistor compare circuit, under an alternative embodiment of FIG. 2.

FIG. 5 is a block diagram of a binary CAM cell 500 that includes a thyristor-based memory cell 502 and a four-transistor compare circuit 504, under another alternative embodiment of FIG. 2. The binary CAM cell 500 includes an n-channel pass transistor 540 in the coupling between the cathode of the thyristor 510 and the gate of transistor 530. The source (drain) of pass transistor 540 is coupled to the cathode of the thyristor 510 and the gate of pass transistor 540. The drain (source) of pass transistor 540 is coupled to the gate of transistor 530.

Likewise, the binary CAM cell 500 includes an n-channel pass transistor 544 in the coupling between the cathode of the thyristor 520 and the gate of transistor 534. The source (drain) of pass transistor 544 is coupled to the cathode of the thyristor 520 and the gate of pass transistor 544. The drain (source) of pass transistor 544 is coupled to the gate of transistor 530. The bulk bias voltage $V_{BB4}$ of pass transistors 540 and 544 can be at or below ground potential, but the embodiment is not so limited.

Yet another method for adjusting the difference between the threshold and gate voltages includes adjusting the threshold voltage of the appropriate n-channel transistors by applying a small positive voltage (a fraction of a volt) $V_{GS}$ between the gate and source of appropriate n-channel transistors, where the appropriate n-channel transistors have gates coupled to the cathodes of NDR devices. The $V_{GS}$ of an embodiment for a particular transistor is equal to or less than the voltage that corresponds to the holding current (threshold voltage) of the NDR device to which that transistor is coupled, for example approximately 0.4 volts. The gate-to-source bias voltage $V_{GS}$ increases the magnitude of the threshold voltage of the transistor so biased to a potential that is high enough to prevent inadvertent conduction in the corresponding transistor when the transistor gate is coupled to a voltage near the threshold voltage, for example a voltage of approximately 0.4 to 0.5 volts.

Figure 6:
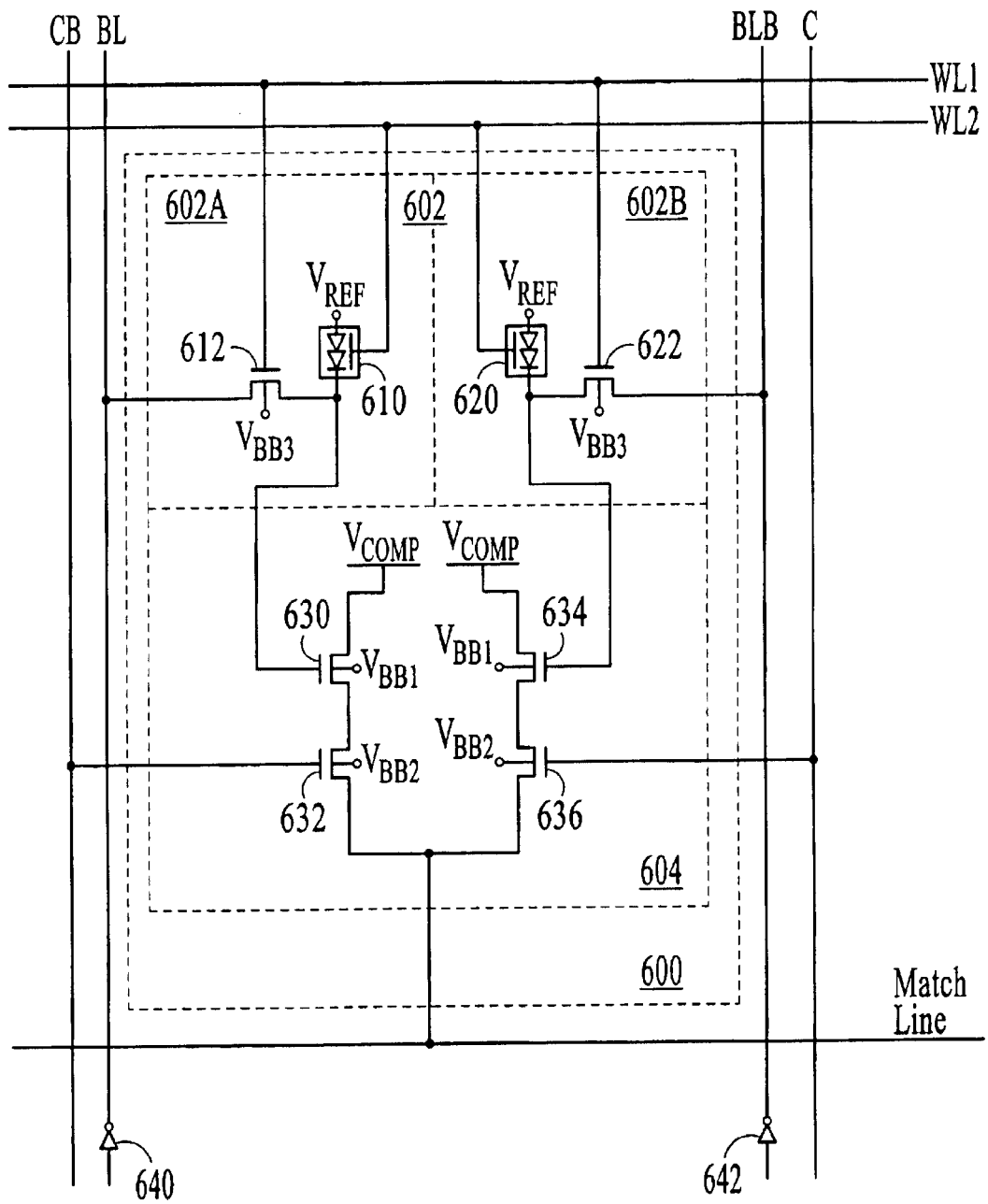
FIG. 6 is a block diagram of a binary CAM cell that includes a thyristor-based memory cell and a four-transistor compare circuit, under another alternative embodiment of FIG. 2.

FIG. 6 is a block diagram of a binary CAM cell 600 that includes a thyristor-based memory cell 602 and a four-transistor compare circuit 604, under another alternative embodiment of FIG. 2. The binary CAM cell 600 includes a compare circuit 604 with two n-channel transistors 630 and 634 that have gates coupled to the cathodes of thyristors 610 and 620, respectively. In this embodiment, the sources of transistors 630 and 634 are coupled to a voltage $V_{COMP}$ ($V_{GS}$) instead of being coupled to ground potential, thereby introducing the gate-to-source bias voltage. The voltage $V_{COMP}$ is approximately 0.4 volts; however, alternative embodiments can use any number of positive potentials depending upon device geometry and circuit configuration.

When using the gate-to-source bias voltage, the match line pre-charge potential can be increased by an amount approximately equal to $V_{COMP}$ to ensure robust match detect margins, but the embodiment is not so limited. As an example, a CAM device match line pre-charged to $V_{DD}$ can instead be pre-charged to a potential approximately equal to the sum of $V_{DD}$ and $V_{COMP}$ when a gate-to-source bias voltage is used with transistors of the compare circuit.

The binary CAM cells described above include memory cells having two thyristor-based RAM cells for data storage along with a compare circuit that includes four n-channel transistors. However, many alternative embodiments of the binary CAM cells are available within the scope of the embodiments presented herein that include a variety of combinations of memory cell and compare circuit types. For example, various embodiments can include single- or double-storage device memory cells in various combinations with compare circuits that include three-transistor circuits, four-transistor circuits, and compare circuits including combinations of n-channel and p-channel transistors, to name a few, but the alternatives are not so limited.

Figure 7:
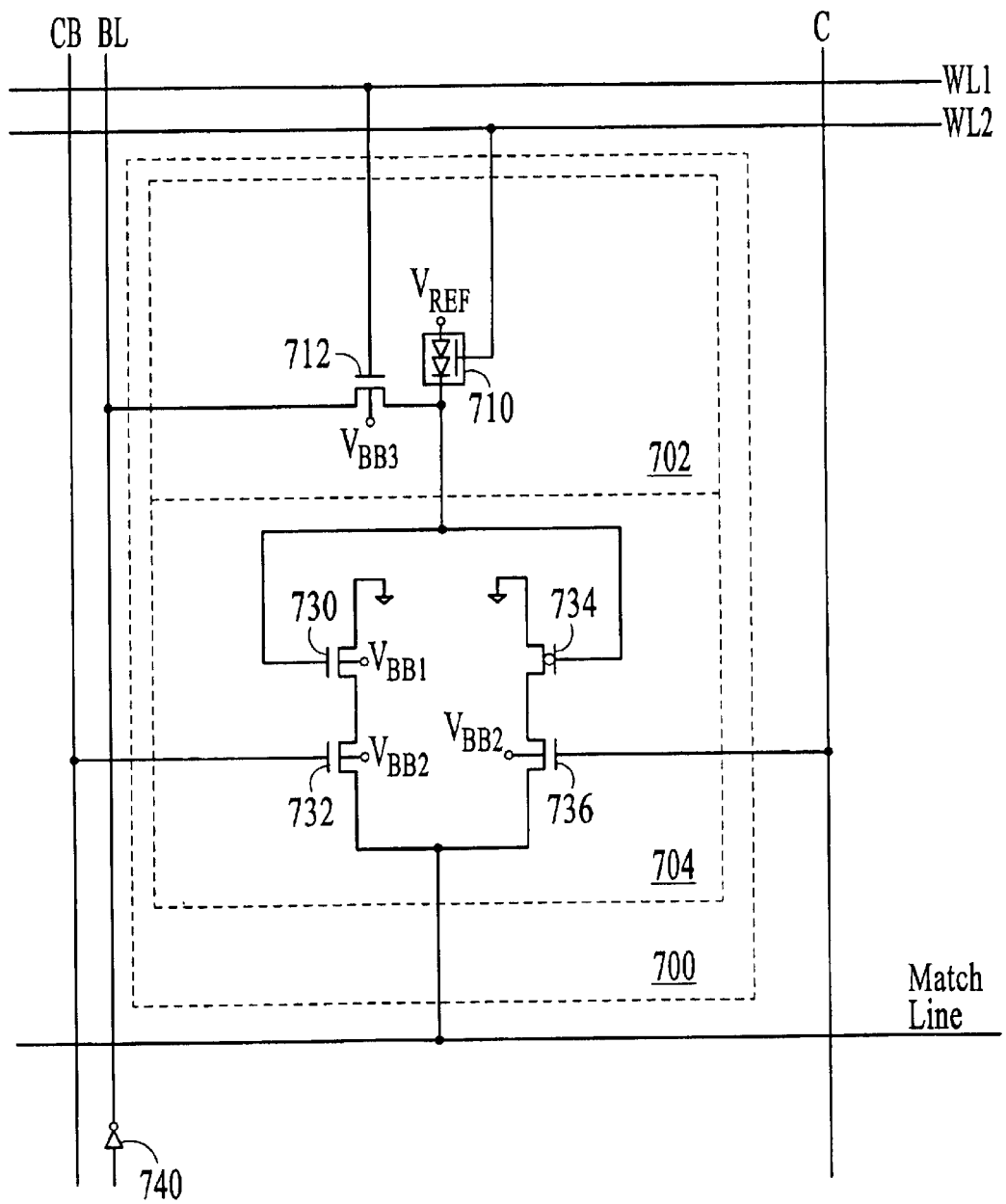
FIG. 7 is a block diagram of a binary CAM cell that includes a thyristor-based memory cell and a four-transistor compare circuit having a combination of n-channel and p-channel transistors, under yet another alternative embodiment of FIG. 2.

FIG. 7 is a block diagram of a binary CAM cell 700 that includes a thyristor-based memory cell 702 and a four-transistor compare circuit 704 having a combination of n-channel and p-channel transistors, under yet another alternative embodiment of FIG. 2. Memory cell 702 is a thyristor-based RAM storage device or cell that includes thyristor 710 and access transistor 712. The thyristor 710 of an embodiment is a capacitively-coupled NDR device with a vertical-surrounding gate, as described above. The anode of thyristor 710 is coupled to a reference voltage $V_{REF}$. The reference voltage $V_{REF}$ of an embodiment is approximately one (1) volt, but is not so limited. The cathode of thyristor 710 is coupled to the gate of n-channel or NMOS transistor 730 and the gate of p-channel or PMOS transistor 734 of the compare circuit 704, but alternative embodiments can use various other types of transistors. The surrounding gate of thyristor 710 is coupled to word line WL2.

The access transistor 712 couples thyristor 710 to data bit line BL. The source (drain) of access transistor 712 is coupled to data bit line BL, while the drain (source) of access transistor 712 is coupled to the cathode of thyristor 710. The gate of access transistor 712 is coupled to word line WL1. The writing of data to and the reading of data from the cell 702 is performed by charge transfer through the bit line BL and access transistor 712 in response to the logical state of the word line WL1 in combination with charge transfer through the thyristor 710 in response to the logical state of word line WL2. The data bit line BL includes an inverter 740, but is not so limited.

Compare circuit 704 compares the data stored in the memory cell 702 with comparand data provided on compare signal lines C and CB. Compare circuit 704 includes transistors 730, 732, 734, and 736 coupled to perform the comparison function. In the compare circuit of an embodiment, transistors 730, 732, 736 are n-channel transistors and transistor 734 is a p-channel transistor, but the embodiment is not so limited. Transistors 730 and 732 are coupled in series to form a first path of the compare circuit 704, and transistors 734 and 736 are coupled in series to form a second path of the compare circuit. The sources (drains) of transistors 732 and 736 are coupled to the match line, while the drains (sources) of transistors 730 and 734 are coupled to ground potential.

Regarding control inputs to each of the transistors 730–736, the gates of transistors 730 and 734 are coupled to receive data from the memory cell 702. The gate of transistor 732 receives comparand data from compare signal line CB and the gate of transistor 736 receives comparand data from compare signal line C. The sources (drains) of transistors 732 and 736 are coupled to the match line. Compare circuit 704 pulls the match line to a logic zero state when the comparand data does not match (i.e., mismatches) the data stored in the memory cell 702.

As transistor 730 is an n-channel transistor coupled to the cathode of the thyristor 710, a negative bulk bias voltage $V_{BB1}$ is applied to transistor 730 to increase the threshold voltage of the transistor and reduce or eliminate the probability of a false mismatch indication, as described above. However, alternative embodiments can use any of the methods described above to eliminate the chances of a transistor being in a "false" conducting state, when the transistor has a gate coupled to the cathode of a thyristor-based storage device. The bulk bias voltage $V_{BB2}$ of n-channel transistors 732 and 736 and the bulk bias voltage $V_{BB3}$ of transistor 712 is at or below ground potential, but is not so limited.

Figure 8:
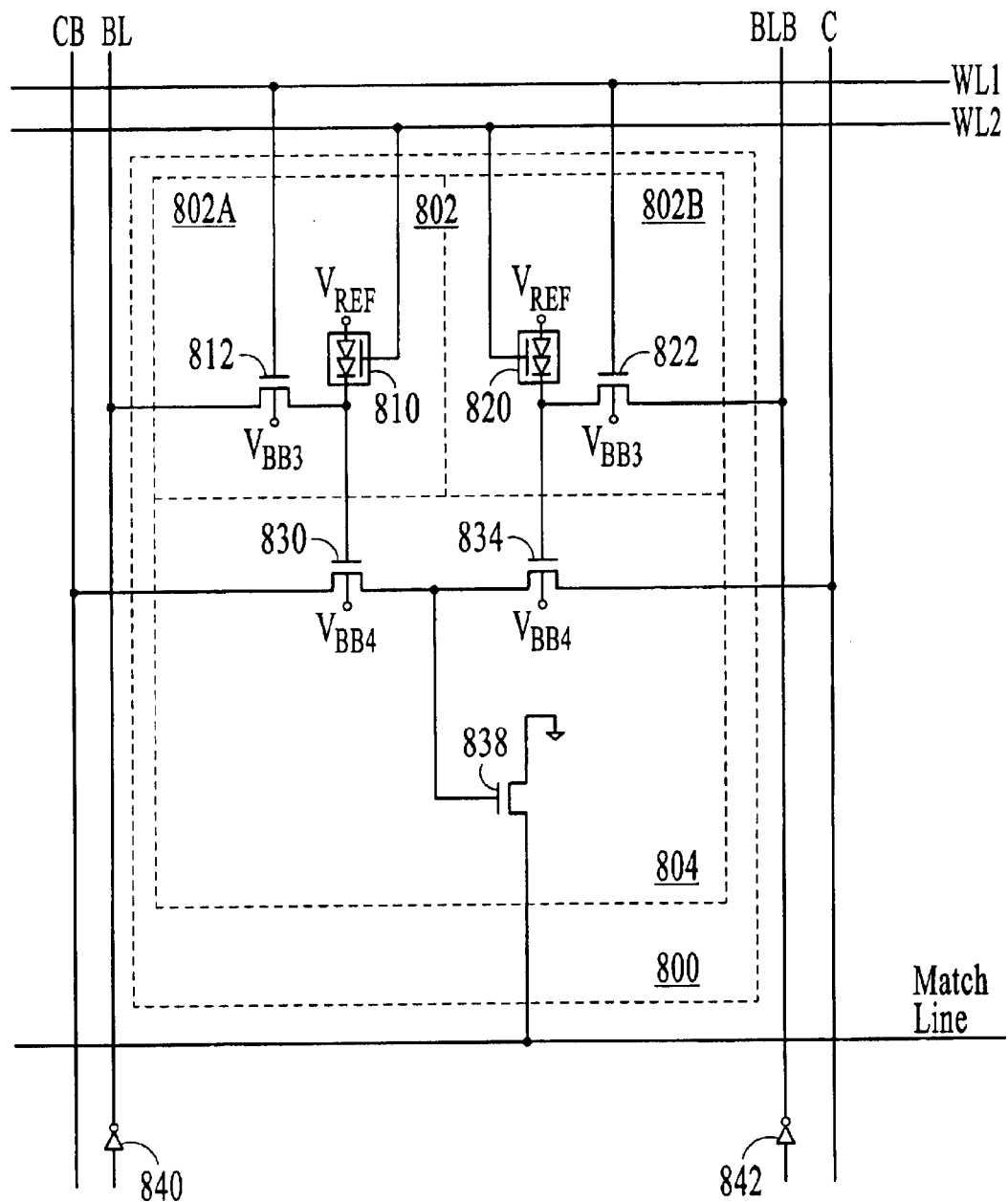
FIG. 8 is a block diagram of a binary CAM cell that includes a thyristor-based memory cell and a three-transistor compare circuit, under an alternative embodiment of FIG. 1.

FIG. 8 is a block diagram of a binary CAM cell 800 that includes a thyristor-based memory cell 802 and a three-transistor compare circuit 804, under an alternative embodiment of FIG. 1. Memory cell 802 is a thyristor-based memory cell including two storage devices or cells 802A and 802B, as described above with reference to FIG. 2.

Compare circuit 804 compares the data stored in the memory cell 802 with comparand data provided on compare signal lines C and CB. Compare circuit 804 includes transistors 830, 834, and 838 that perform the comparison function. Each of transistors 830, 834, and 838 are n-channel transistors, but the embodiment is not so limited. The source (drain) of transistor 830 is coupled to compare signal line CB and the drain (source) is coupled to the gate of transistor 838. The source (drain) of transistor 834 is coupled to compare signal line C and the drain (source) is coupled to the gate of transistor 838. The gate of transistor 830 is coupled to memory cell 802A to receive data stored therein and, likewise, the gate of transistor 834 is coupled to memory cell 802B. Transistor 838 is a match transistor having the source (drain) coupled to the match line and the drain (source) coupled to ground potential. When the comparand data matches the data stored in the memory cell 802, the match line remains at a pre-charged state.

As transistors 830 and 834 are n-channel transistors coupled to the cathodes of thyristors 810 and 820, respectively, a negative bulk bias voltage $V_{BB4}$ is applied to transistors 810 and 820 to increase the threshold voltage of the transistors and reduce or eliminate the chances of a false mismatch indication, as described above. However, alternative embodiments can use any of the methods described above to eliminate the chances of a transistor being in a "false" conducting state, when the transistor has a gate coupled to the cathode of a thyristor-based storage device. The bulk bias voltage of transistors 812, 822, and 838 is at or below ground potential, but is not so limited.

Figure 9:
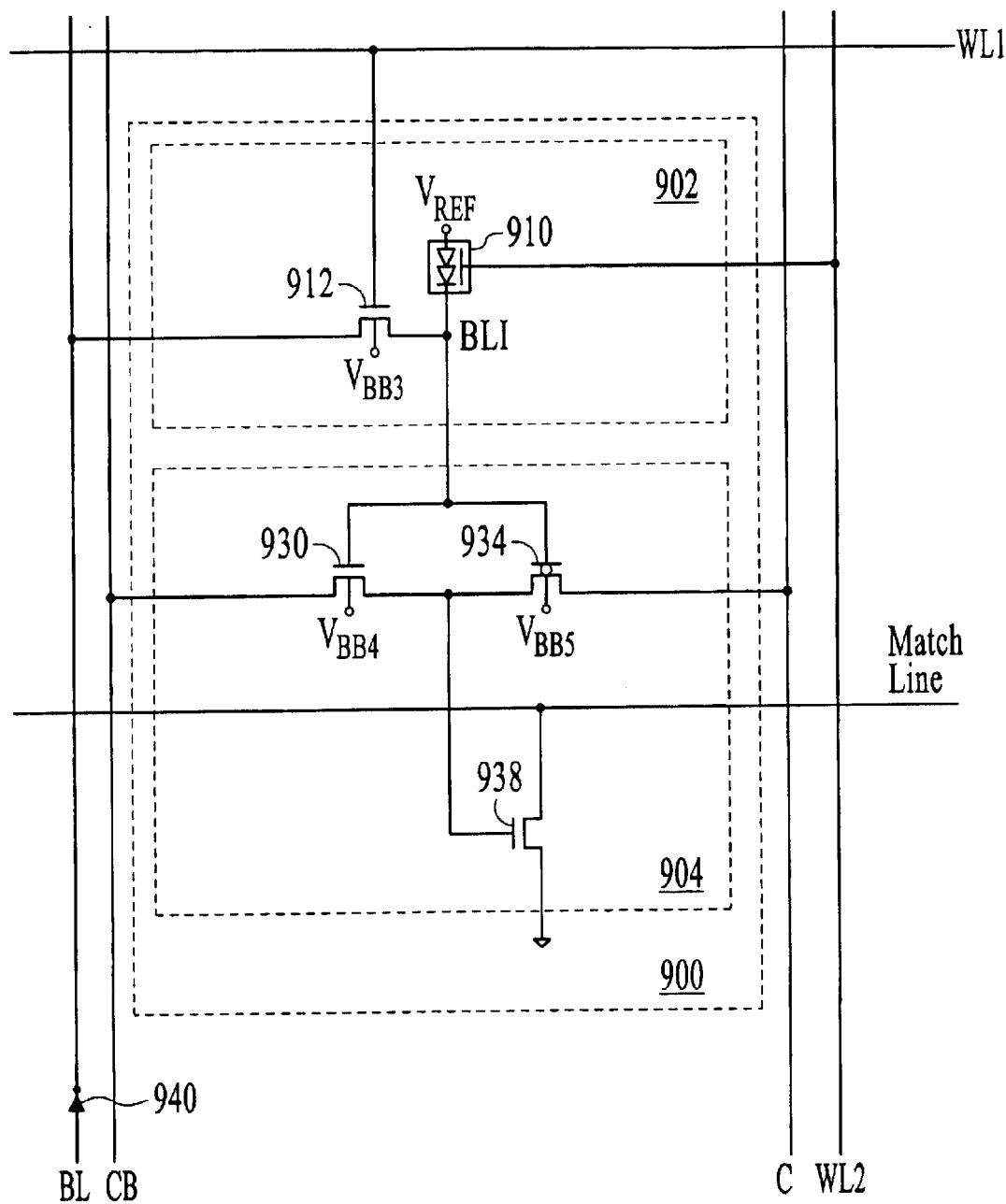
FIG. 9 is a block diagram of a binary CAM cell that includes a thyristor-based memory cell and a three-transistor compare circuit having a combination of n-channel and p-channel transistors, under an alternative embodiment of FIG. 8.

FIG. 9 is a block diagram of a binary CAM cell 900 that includes a thyristor-based memory cell 902 and a three-transistor compare circuit 904 having a combination of n-channel and p-channel transistors, under an alternative embodiment of FIG. 8. Memory cell 902 is a thyristor-based memory cell including a single SRAM storage device, as described above with reference to FIG. 7.

Compare circuit 904 compares the data stored in the memory cell 902 with comparand data provided on compare signal lines C and CB. Compare circuit 904 includes transistors 930, 934, and 938 that perform the comparison function. Each of transistors 930 and 938 are n-channel transistors while transistor 934 is a p-channel transistor, but the embodiment is not so limited. The source (drain) of transistor 930 is coupled to compare signal line CB and the drain (source) is coupled to the gate of transistor 938. The source (drain) of transistor 934 is coupled to compare signal line C and the drain (source) is coupled to the gate of transistor 938. The gates of both transistor 930 and 934 are coupled to memory cell 902 to receive data stored therein. Transistor 938 is a match transistor having the source (drain) coupled to the match line and the drain (source) coupled to ground potential. When the comparand data matches the data stored in the memory cell 902, the match line remains at a pre-charged state.

Transistor 930 is an n-channel transistor coupled to the cathode of thyristor 910 and, as such, includes a negative bulk bias voltage $V_{BB4}$ to increase the threshold voltage of the transistor 930 and reduce or eliminate the chances of a false mismatch indication, as described above. However, alternative embodiments can use any of the methods described above to eliminate the chances of a transistor being in a "false" conducting state, when the transistor has a gate coupled to the cathode of a thyristor-based storage device.

The bulk bias voltage of transistors 912 and 938 is at or below ground potential, but is not so limited. However, transistor 934 is a p-channel transistor coupled to the cathode of thyristor 910 and, as such, includes a bulk bias voltage $V_{BB5}$ to reduce the threshold voltage of the transistor 934 and reduce or eliminate the chances of a false mismatch indication, as described above. However, alternative embodiments can use any of the methods described above to eliminate the chances of a transistor being in a "false" conducting state, when the transistor has a gate coupled to the cathode of a thyristor-based storage device.

Alternatives to the binary CAM cells described above include ternary CAM cells having RAM cells for data storage under a variety of embodiments supported within the scope of the embodiments described above. For example, various embodiments can include single- and/or double-storage device memory cells in various combinations with compare circuits that include three-transistor circuits, four-transistor circuits, and compare circuits including combinations of n-channel and p-channel transistors, to name a few, but the alternatives are not so limited.

Figure 10:
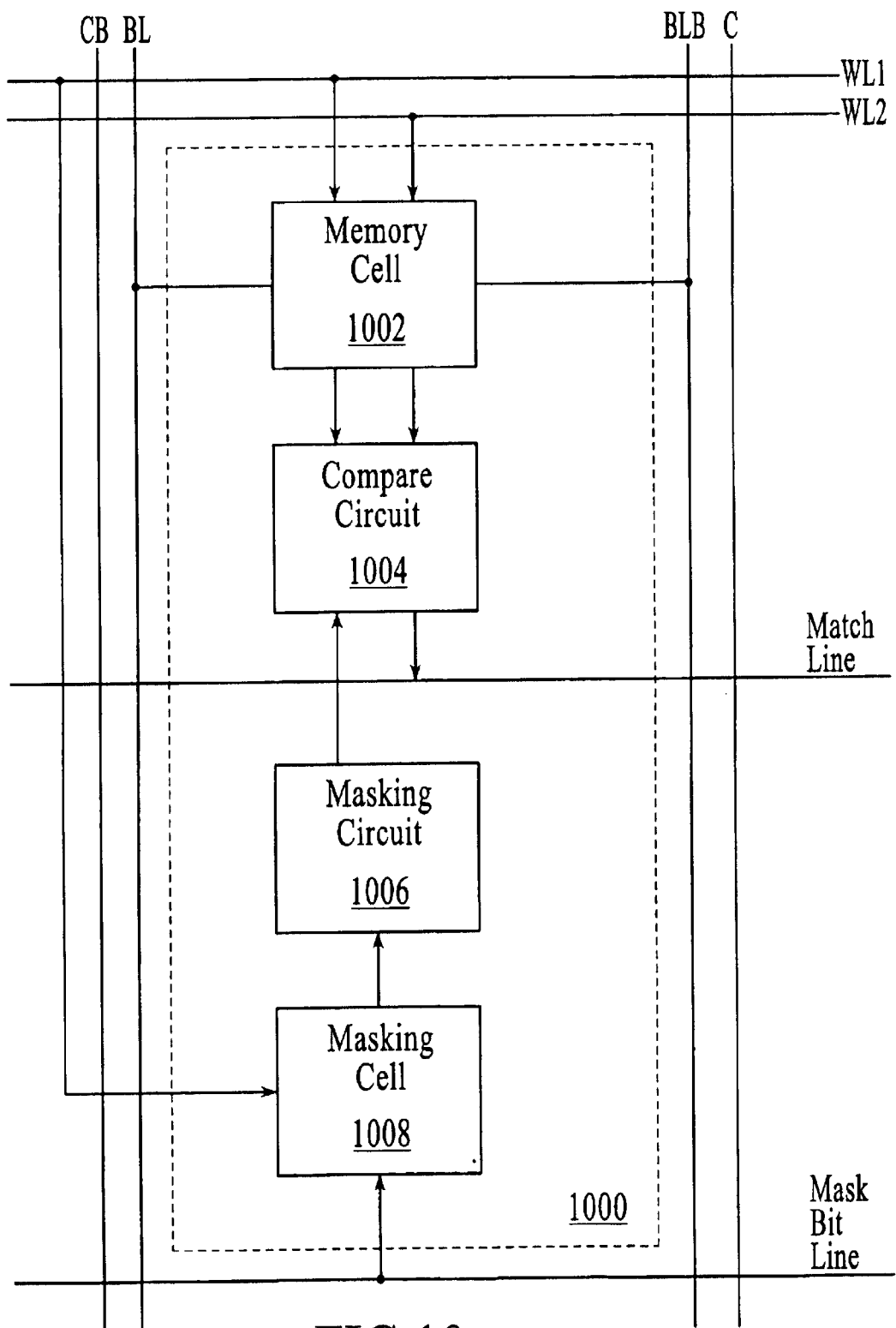
FIG. 10 is a block diagram of a ternary CAM cell that includes a thyristor-based memory cell, under an embodiment.

FIG. 10 is a block diagram of a ternary CAM cell 1000 that includes a thyristor-based memory cell 1002, under an embodiment. The ternary CAM cell 1000 includes memory cell 1002, compare circuit 1004, masking circuit 1006, and masking cell 1008. Memory cell 1002 stores data to be compared with comparand data provided on compare signal lines C and CB. The memory cell 1002 is a thyristor-based memory cell, but alternative embodiments may include any number and/or type of memory storage element, including volatile or nonvolatile memory storage elements. Data is written to and read from the memory cell 1002 via the data bit lines BL and BLB when the word lines WL1 and WL2 are asserted to a predetermined logic state. Alternative embodiments may write data to or read data from the memory cell 1002 using any number/combination of bit lines or other data or bus lines.

Compare circuit 104 compares the data stored in the memory cell 1002 with comparand data provided on compare signal lines C and CB. Compare circuit 1004 includes transistors coupled to perform the comparison function. Compare circuit 1004 pulls the match line to a logic zero state when the comparand data does not match (i.e., mismatches) the data stored in the memory cell 1002 and when the mask circuit 1006 does not mask the comparison result.

Masking cell 1008 includes a memory or storage cell that stores local mask data for the ternary CAM cell 1000. Embodiments of the masking cell 1008 can include any type of memory storage element including those described below as well as any volatile or nonvolatile memory storage element. The local mask data can be written to or read from the masking cell 1088 via the mask bit line when the word line(s) is asserted to a predetermined logic state. Alternative embodiments may write data to or read data from the masking cell 1008 using any number/combination of bit lines or other data or bus lines. The word line of this embodiment is shared with the memory cell 1002, but is not so limited.

The local mask data of the masking cell 1008 is used by the masking circuit 1006 to control whether the compare result generated by compare circuit 1004 as a result of the comparison between the comparand data and the data of the memory cell 1002 will affect the logical state of the match line. When the local mask data indicates that the comparison should be masked, masking circuit 1006 effectively disables compare circuit 1004 such that the comparison results of the compare circuit 1004 do not control the match line logic state. When the local mask data indicates that the comparison should not be masked, masking circuit 1006 allows the comparison result generated by compare circuit 1004 to control the match line logic state (assuming compare operations of other CAM cells coupled to the match line also indicate a match).

The match line couples the ternary CAM cell 1000 of an embodiment to a number of other CAM cells (not shown) to form a row of a CAM device. Furthermore, the match line couples the CAM cells of the row, including CAM cell 1000, to a pre-charge circuit (not shown). The pre-charge circuit initially pre-charges the match line to a logic one state, but is not so limited. If there is an unmasked match, masked match, or masked mismatch, the match line remains pre-charged to the logic one state. If there is an unmasked mismatch, however, compare circuit 1004 couples the match line for discharge to a logic zero state (e.g., for example via masking circuit 1006).

The match line also couples the CAM cells of a row, including CAM cell 1000, to an encoder (e.g., a priority encoder) that is not shown, but is not so limited.

Figure 11:
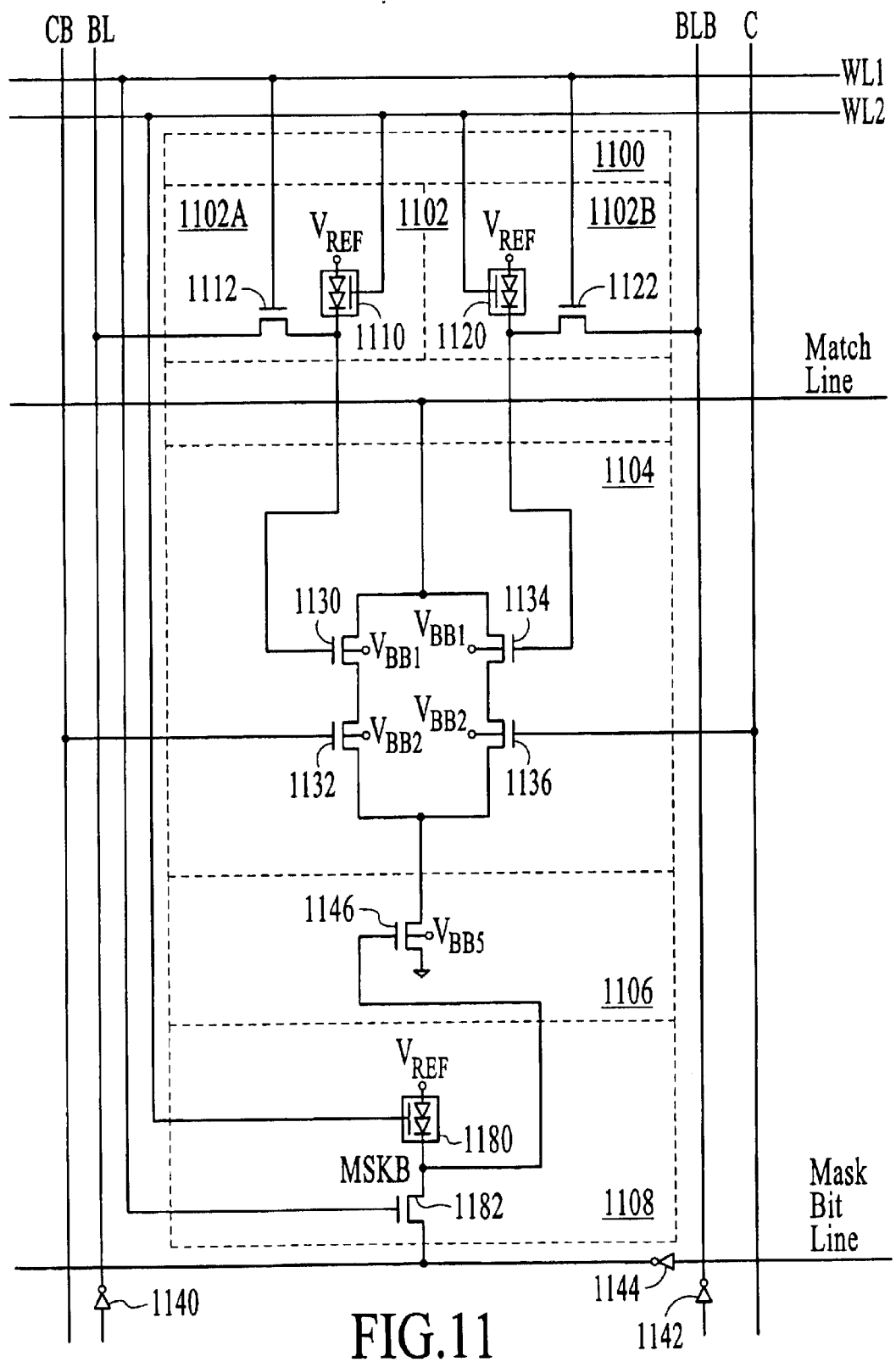
FIG. 11 is a block diagram of a ternary CAM cell that includes a thyristor-based memory cell and a thyristor-based masking cell, under the embodiment of FIG. 10.

FIG. 11 is a block diagram of a ternary CAM cell 1100 that includes a thyristor-based memory cell 1102 and a thyristor-based masking cell 1108, under the embodiment of FIG. 10. Memory cell 1102 is a thyristor-based memory cell including two storage devices or cells 1102A and 1102B, as described above with reference to FIG. 2. Likewise, compare circuit 1104 includes four n-channel transistors 1130, 1132, 1134, and 1136, as described above with reference to FIG. 2.

Masking cell 1108 is a RAM storage device or cell that includes thyristor 1180 and access transistor 1182. The thyristor 1180 of an embodiment is a capacitively-coupled NDR device with a vertical-surrounding gate, as described above. The anode of thyristor 1180 is coupled to a reference voltage $V_{REF}$. The reference voltage $V_{REF}$ of an embodiment is approximately one (1) volt, but is not so limited.

The access transistor 1182 couples thyristor 1180 to the mask bit line. The source (drain) of access transistor 1182 is coupled to the mask bit line, while the drain (source) of access transistor 1182 is coupled to the cathode of thyristor 1180. The gate of access transistor 1182 is coupled to word line WL1. The writing of local mask data to the masking cell 1108 is performed by charge transfer through the mask bit line and access transistor 1182 in response to the logical state of the word line WL1 in combination with charge transfer through the thyristor 1180 in response to the logical state of word line WL2. The mask bit line includes an inverter 1144, but is not so limited.

Masking circuit 1106 includes a mask control transistor 1146. The source (drain) of mask control transistor 1146 is coupled to the drains (sources) of n-channel transistors 1132 and 1136 of compare circuit 1104. The drain (source) of mask control transistor 1146 is coupled to ground potential. Mask control transistor 1146 is an n-channel transistor coupled to the cathode of thyristor 1180 and, as such, includes a negative bulk bias voltage $V_{BB5}$ to increase the threshold voltage of the transistor 1146 and reduce or eliminate the chances of a false non-mask condition, as described above with reference to the false mismatch indication.

Local mask data of the masking cell 1108 controls the gate, and thus the conducting state, of mask control transistor 1146. When the local mask data is a logic one indicating a non-mask condition, mask control transistor 1146 is conducting or "on" such that the compare results generated by compare circuit 1004 control the logical state of the match line via the coupled path to ground potential. When, however, the local mask data is a logic zero indicating a mask condition, mask control transistor 1146 is non-conducting or "off" such that the compare results generated by compare circuit 1004 do not affect the logical state of the match line because of the absence of a discharge path to ground potential.

Figure 12:
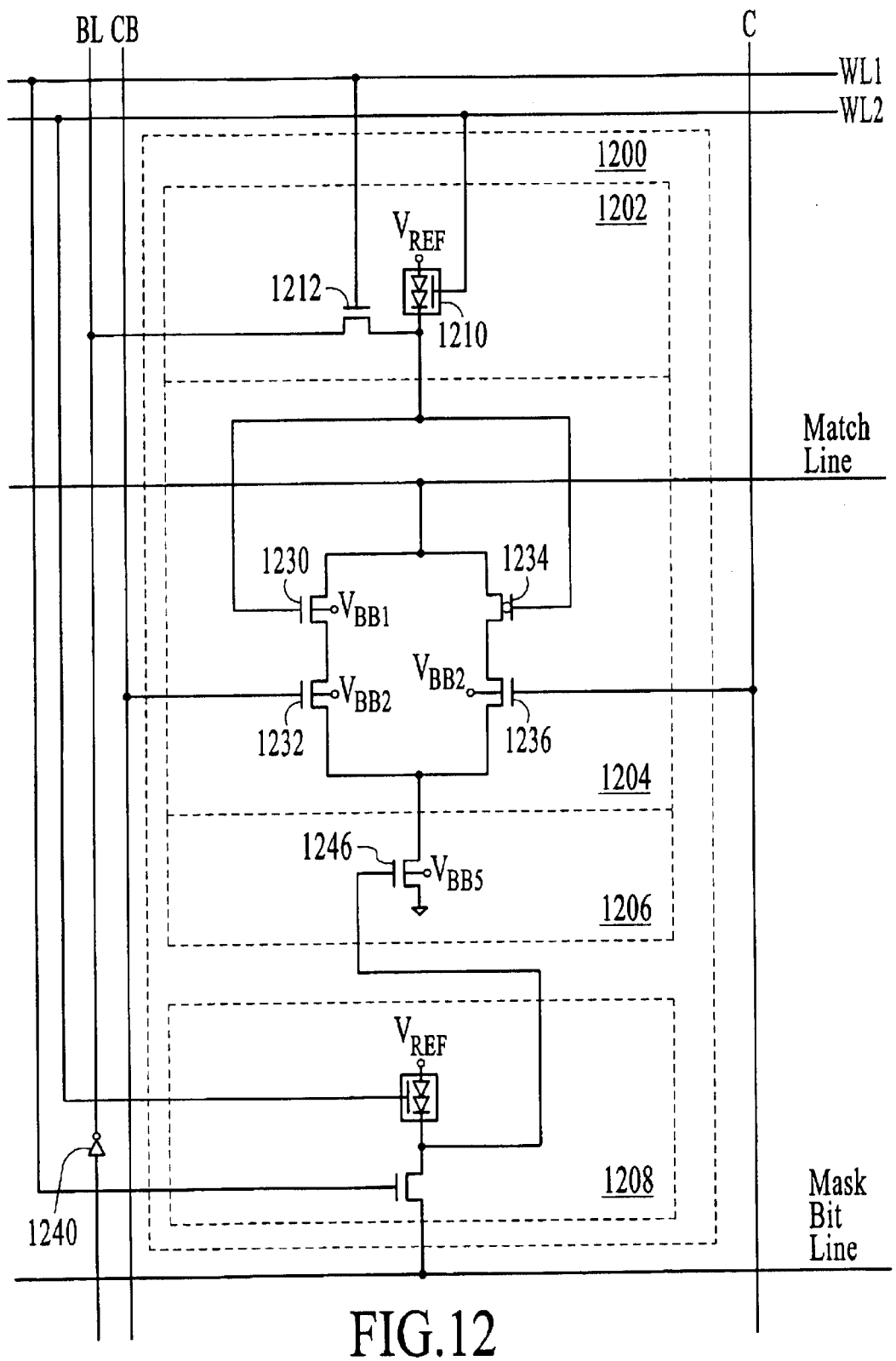
FIG. 12 is a block diagram of a ternary CAM cell including a thyristor-based memory cell and a four-transistor compare circuit having a combination of n-channel and p-channel transistors, under an alternative embodiment of FIG. 11.

FIG. 12 is a block diagram of a ternary CAM cell 1200 including a thyristor-based memory cell 1202 and a four-transistor compare circuit 1204 having a combination of n-channel and p-channel transistors, under an alternative embodiment of FIG. 11. Memory cell 1202 is a storage device or cell that includes thyristor 1210 and access transistor 1212, as described above with reference to FIG. 7. Likewise, compare circuit 1204 includes one p-channel transistor 1234 and three n-channel transistors 1230, 1232, and 1236, as described above with reference to FIG. 7.

Masking cell 1208 is a storage device or cell that includes thyristor 1280 and access transistor 1282, as described above with reference to FIG. 11. Additionally, masking circuit 1206 includes a mask control transistor 1246, as described above with reference to FIG. 11.

Figure 13:
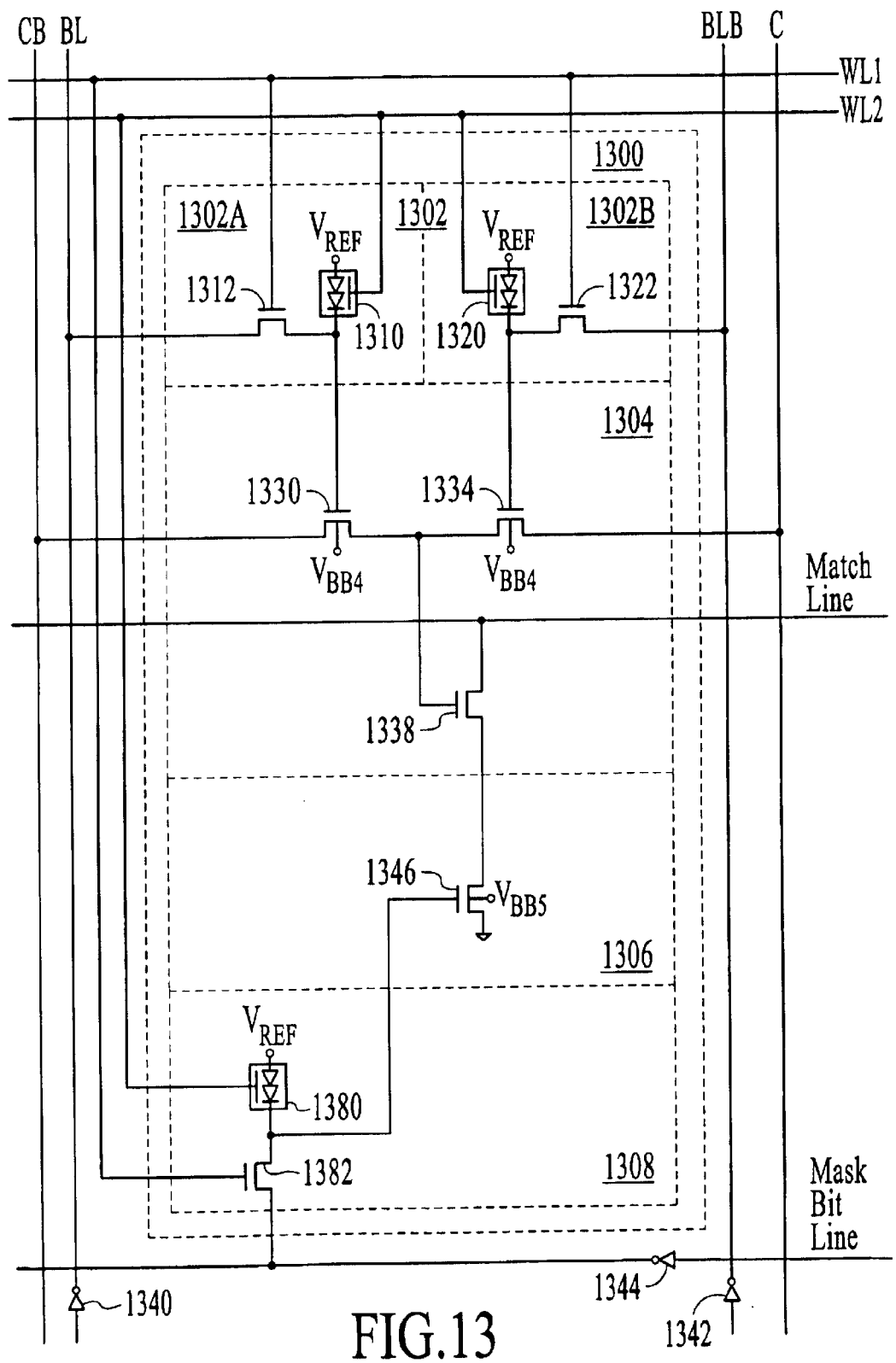
FIG. 13 is a block diagram of a ternary CAM cell including a thyristor-based memory cell and a three-transistor compare circuit, under an alternative embodiment of FIG. 10.

FIG. 13 is a block diagram of a ternary CAM cell 1300 including a thyristor-based memory cell 1302 and a three-transistor compare circuit 1304, under an alternative embodiment of FIG. 10. Memory cell 1302 is a thyristor-based memory cell including two storage devices or cells 1302A and 1302B, as described above with reference to FIG. 8. Likewise, compare circuit 1304 includes three n-channel transistors 1330, 1334, and 1338, as described above with reference to FIG. 8. Ternary CAM cell 1300 also includes masking circuit 1306, as described above with reference to FIG. 11. Furthermore, masking cell 1308 is a storage device or cell that includes thyristor 1380 and access transistor 1382, as described above with reference to FIG. 11.

Figure 14:
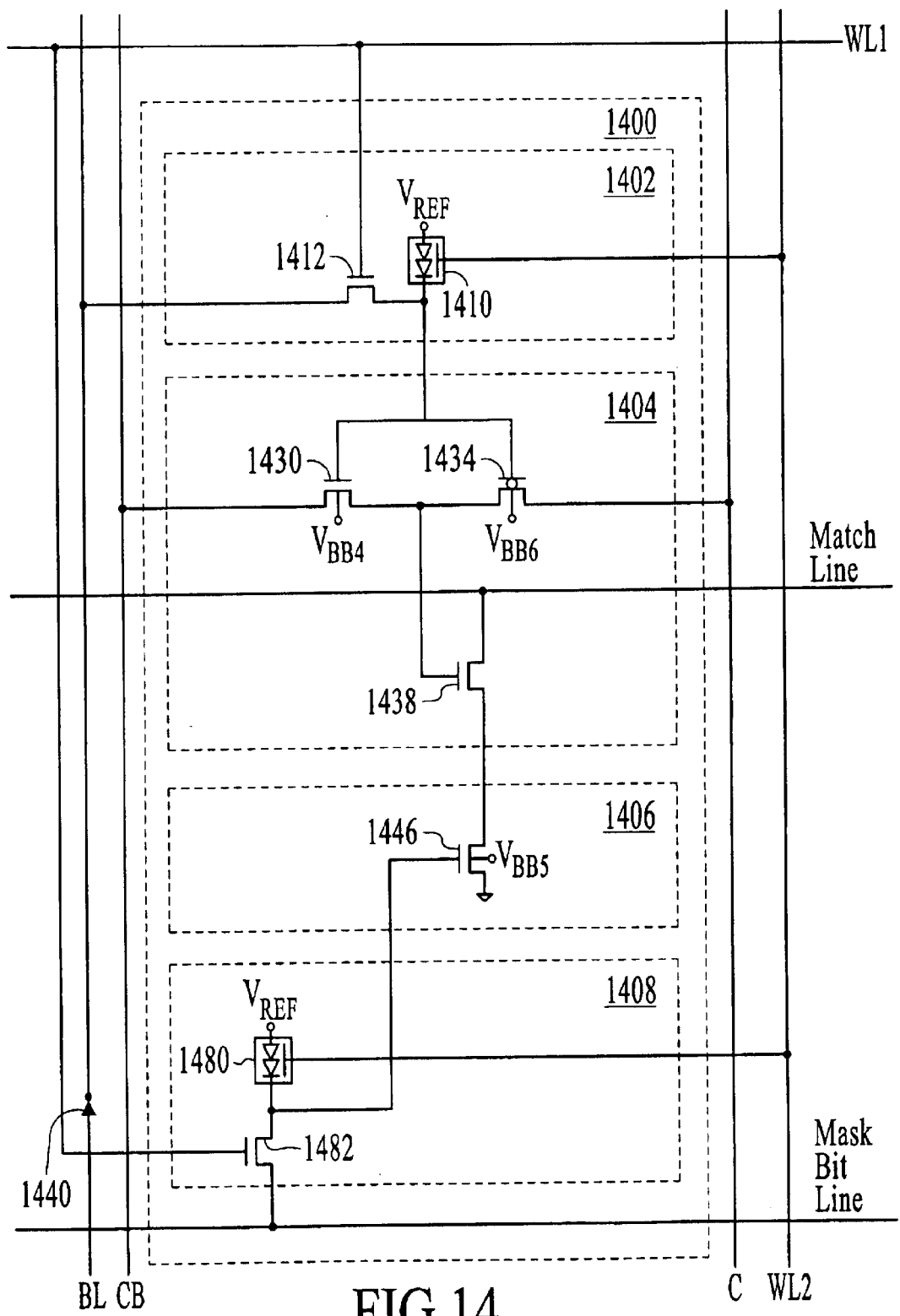
FIG. 14 is a block diagram of a ternary CAM cell including a thyristor-based memory cell and a three-transistor compare circuit having a combination of n-channel and p-channel transistors, under an alternative embodiment of FIG. 13.

FIG. 14 is a block diagram of a ternary CAM cell 1400 including a thyristor-based memory cell 1402 and a three-transistor compare circuit 1404 having a combination of n-channel and p-channel transistors, under an alternative embodiment of FIG. 13. Memory cell 1402 is a thyristor-based memory cell including a single storage device, as described with reference to FIG. 9. Compare circuit 1404 performs the comparison function using n-channel transistors 1430 and 1438 along with p-channel transistor 1434, also as described above with reference to FIG. 9. Ternary CAM cell 1400 also includes masking circuit 1406 and masking cell 1408, each as described above with reference to FIG. 11.

Figure 15:
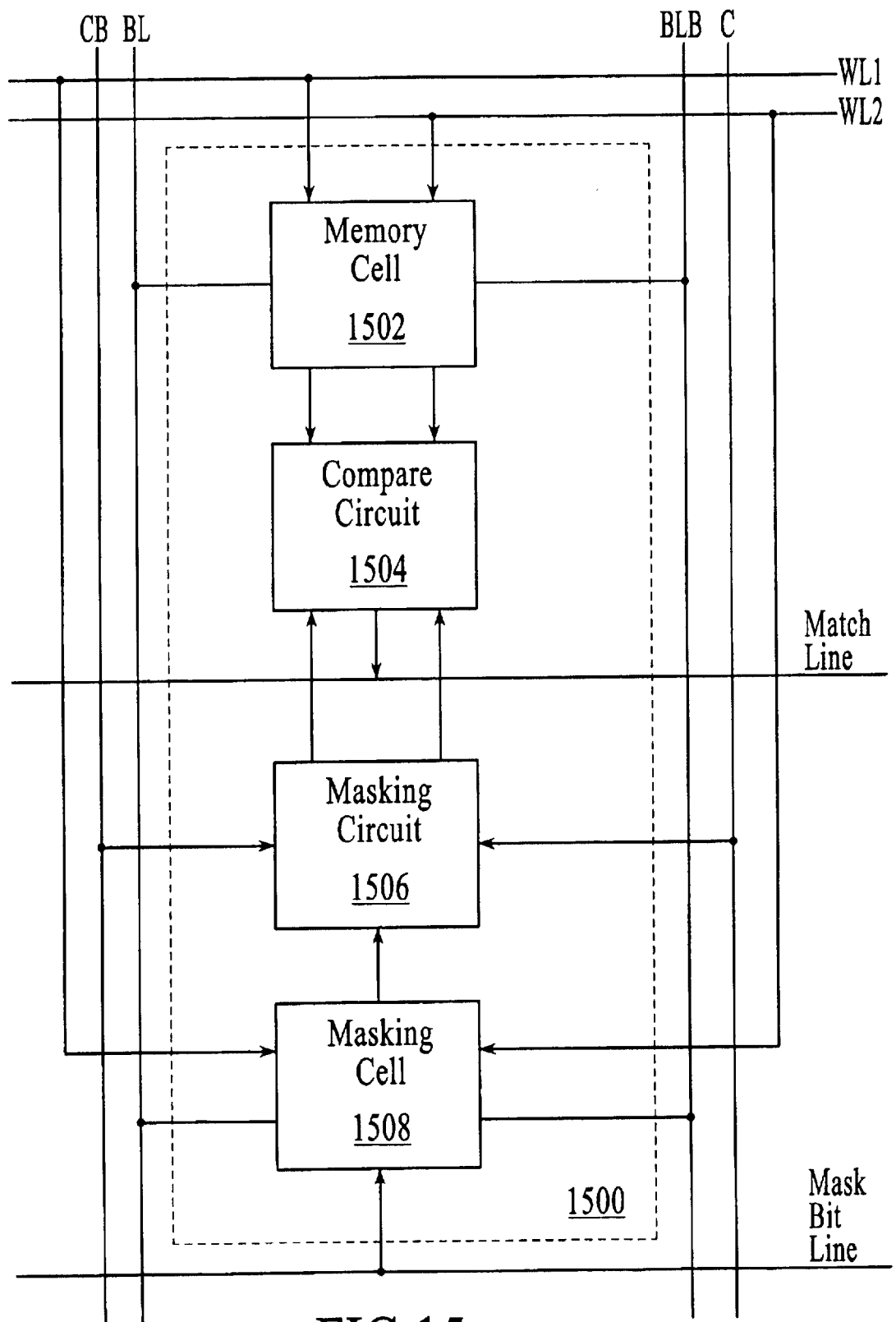
FIG. 15 is a block diagram of a ternary CAM cell that includes a thyristor-based memory cell and a masking circuit that controls masking of comparand data, under an alternative embodiment of FIG. 10.

FIG. 15 is a block diagram of a ternary CAM cell 1500 that includes a thyristor-based memory cell 1502 and a masking circuit 1506 that controls masking of comparand data, under an alternative embodiment of FIG. 10. The ternary CAM cell 1500 also includes a compare circuit 1504 and a masking cell 1508, but is not so limited. A match line couples the ternary CAM cell 1500 of an embodiment to a number of other CAM cells (not shown) to form a row of a CAM device. Furthermore, the match line couples the CAM cells of the row to a pre-charge circuit (not shown) and a sense amplifier (not shown).

Memory cell 1502 stores data to be compared with comparand data provided on compare signal lines C and CB during a compare operation. The memory cell 1502 is a thyristor-based RAM cell, but alternative embodiments may include any number and/or type of memory storage element, including volatile or nonvolatile memory storage elements. When the memory cell 1502 is selected by signals of the word lines WL1 and WL2, data may be read from or written to the memory cell 1502 via the bit lines BL and BLB.

The compare circuit 1504 is coupled to memory cell 1502 and compares the data stored in the memory cell 1502 with data provided by the masking circuit 1506. The compare circuit 1504 controls the logic state of the match line, and the comparison result is determined by evaluating the logic state of the match line.

The masking cell 1508 stores local masking data that indicates whether the comparand data provided on compare signal lines C and CB is masked during a comparison operation. Masking cell 1508 can be a thyristor-based RAM cell, but alternative embodiments may include any number and/or type of memory storage element, including volatile or nonvolatile memory storage elements. When the masking cell 1508 is selected by the word lines, local mask data may be read from or written to the masking cell 1508 via the mask bit line. The masking circuit 1506 receives the local mask data from the masking cell 1508 and, in response thereto, provides either comparand data of compare signal lines C and CB or masked data to compare circuit 1504. Thus, in response to the local mask data stored in the masking cell 1508, masking circuit 1506 either provides the comparand data or masked comparand data to the compare circuit 1504.

For example, when the local mask data stored in masking cell 1508 indicates that the data in memory cell 1502 should be masked from a comparison with the comparand data, masking circuit 1508 provides masked comparand data to compare circuit 1504 such that compare circuit 1504 controls the match line to always provide a match indication regardless of whether the data stored in memory cell 1502 actually matches the comparand data. When the local mask data stored in the masking cell 1508 indicates that the data stored in memory cell 1502 should not be masked from a comparison with the comparand data, the masking circuit 1506 provides the comparand data to compare circuit 1504 to compare with the data stored in memory cell 1502.

Figure 16:
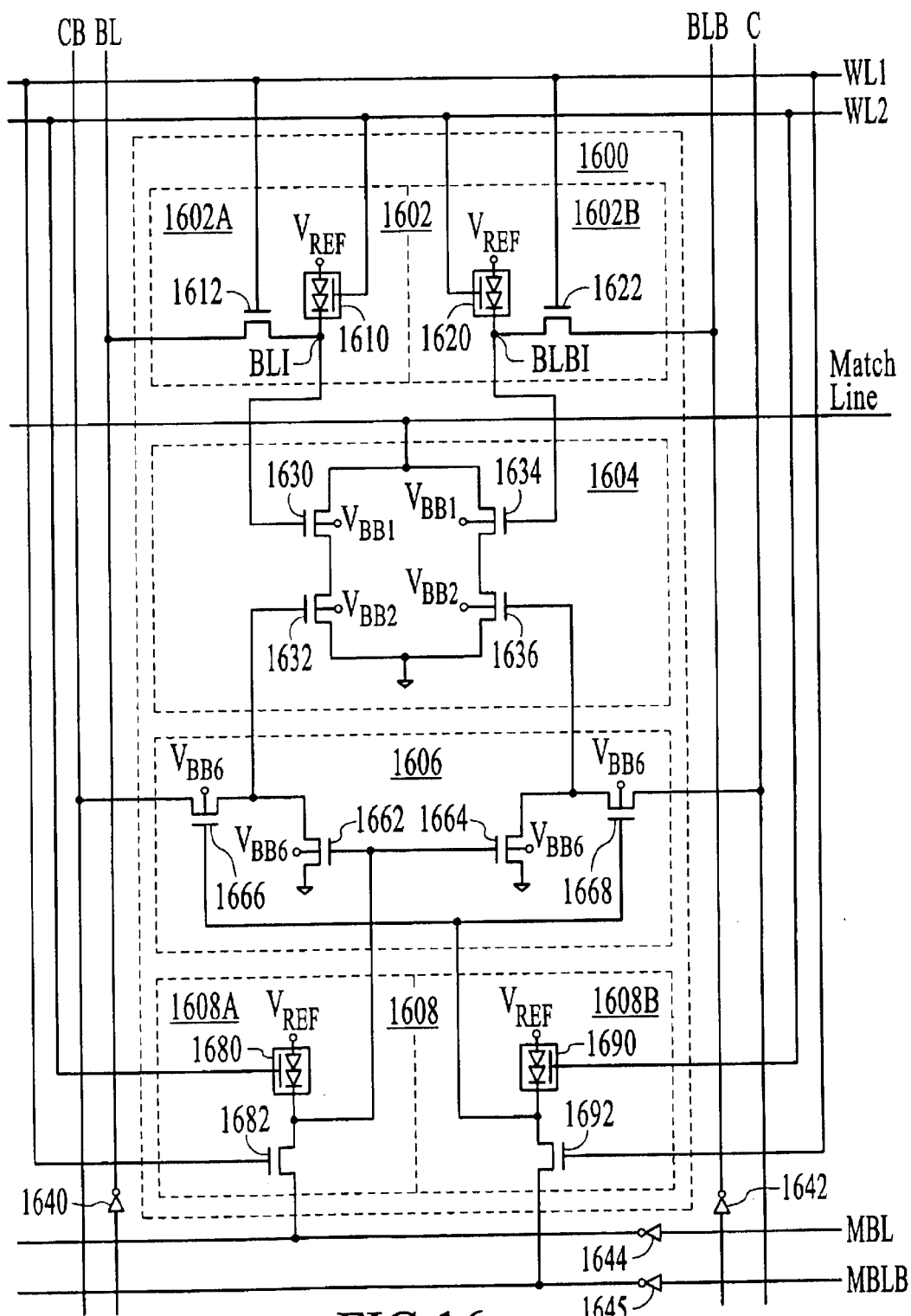
FIG. 16 is a block diagram of a ternary CAM cell that includes a thyristor-based memory cell and a thyristor-based masking cell, under the embodiment of FIG. 15.

FIG. 16 is a block diagram of a ternary CAM cell 1600 that includes a thyristor-based memory cell 1602 and a thyristor-based masking cell 1604, under the embodiment of FIG. 15. Memory cell 1602 is a thyristor-based memory cell including two storage devices or cells 1602A and 1602B, as described above with reference to FIG. 2. Likewise, compare circuit 1604 includes four n-channel transistors 1630, 1632, 1634, and 1636, as described above with reference to FIG. 2.

Masking cell 1608 is a thyristor-based memory cell including two SRAM storage devices or cells 1608A and 1608B. The first SRAM cell 1608A includes thyristor 1680 and access transistor 1682. The thyristor 1680 of an embodiment is a capacitively-coupled NDR device with a vertical-surrounding gate, as described above, the anode of which is coupled to a reference voltage $V_{REF}$. The reference voltage $V_{REF}$ of an embodiment is approximately one (1) volt, but is not so limited. The cathode of thyristor 1680 is coupled to the gate of n-channel transistors 1662 and 1664 of the masking circuit 1606, but alternative embodiments can use various other types of transistors. The surrounding gate of thyristor 1680 is coupled to word line WL2.

The access transistor 1682 couples thyristor 1680 to the mask bit line MBL. The source (drain) of access transistor 1682 is coupled to the mask bit line MBL, while the drain (source) of access transistor 1682 is coupled to the cathode of thyristor 1680. The gate of access transistor 1682 is coupled to word line WL1. The writing of data to and the reading of data from the first SRAM cell 1608A is performed by charge transfer through the mask bit line MBL and access transistor 1682 in response to the logical state of the word line WL1 in combination with charge transfer through the thyristor 1680 in response to the logical state of word line WL2, as described above. The mask bit line MBL includes an inverter 1644, but is not so limited.

The second cell 1608B includes thyristor 1690 and access transistor 1692. The thyristor 1690 of an embodiment is a capacitively-coupled NDR device with a vertical-surrounding gate and an anode coupled to a reference voltage $V_{REF}$. The cathode of thyristor 1690 is coupled to the gate of n-channel transistors 1666 and 1668 of the masking circuit 1606, but alternative embodiments can use various other types of transistors. The surrounding gate of thyristor 1690 is coupled to word line WL2.

The access transistor 1692 couples thyristor 1690 to the mask bit line MBLB. The source (drain) of access transistor 1692 is coupled to the mask bit line MBLB, while the drain (source) of access transistor 1692 is coupled to the cathode of thyristor 1690. The gate of access transistor 1692 is coupled to word line WL1. The writing of data to and the reading of data from the second SRAM cell 1608B is performed by charge transfer through the mask bit line MBLB and access transistor 1692 in response to the logical state of the word line WL1 in combination with charge transfer through the thyristor 1690 in response to the logical state of word line WL2. The mask bit line MBLB includes an inverter 1645, but is not so limited.

The local mask data of the masking cell 1608 controls the masking circuit 1606. Masking circuit 1606 includes n-channel transistors 1662 and 1666 that determine whether comparand data or masked data is provided to the left path of the compare circuit 1604 in response to the masking data. Transistor 1666 has the source (drain) coupled to comparand signal line CB, the drain (source) coupled to the gate of transistor 1632 of the compare circuit 1604, and the gate coupled to storage device 1608B of the masking cell 1608. Transistor 1662 has the drain (source) coupled to the gate of transistor 1632 of the compare circuit 1604, the source (drain) coupled to ground potential, and the gate coupled to storage device 1608A of the masking cell 1608.

Masking circuit 1606 further includes n-channel transistors 1664 and 1668 that determine whether comparand data or masked data is provided to the right path of the compare circuit 1604 in response to the masking data. Transistor 1668 has the source (drain) coupled to comparand signal line C, the drain (source) coupled to the gate of transistor 1636 of the compare circuit 1604, and the gate coupled to storage device 1608B of the masking cell 1608. Transistor 1664 has the drain (source) coupled to the gate of transistor 1636 of the compare circuit 1604, the source (drain) coupled to ground potential, and the gate coupled to storage device 1608A of the masking cell 1608.

As transistors 1662, 1664, 1666, and 1668 are n-channel transistors coupled to the cathodes of thyristors, a negative bulk bias voltage $V_{BB6}$ is applied to transistors 1662, 1664, 1666, and 1668 to increase the threshold voltage of the transistors and reduce or eliminate the chances of a false mask indication, as described above. However, alternative embodiments can use any of the methods described above to eliminate the chances of a transistor being in a "false" conducting state, when the transistor has a gate coupled to the cathode of a thyristor-based storage device.

Figure 17:
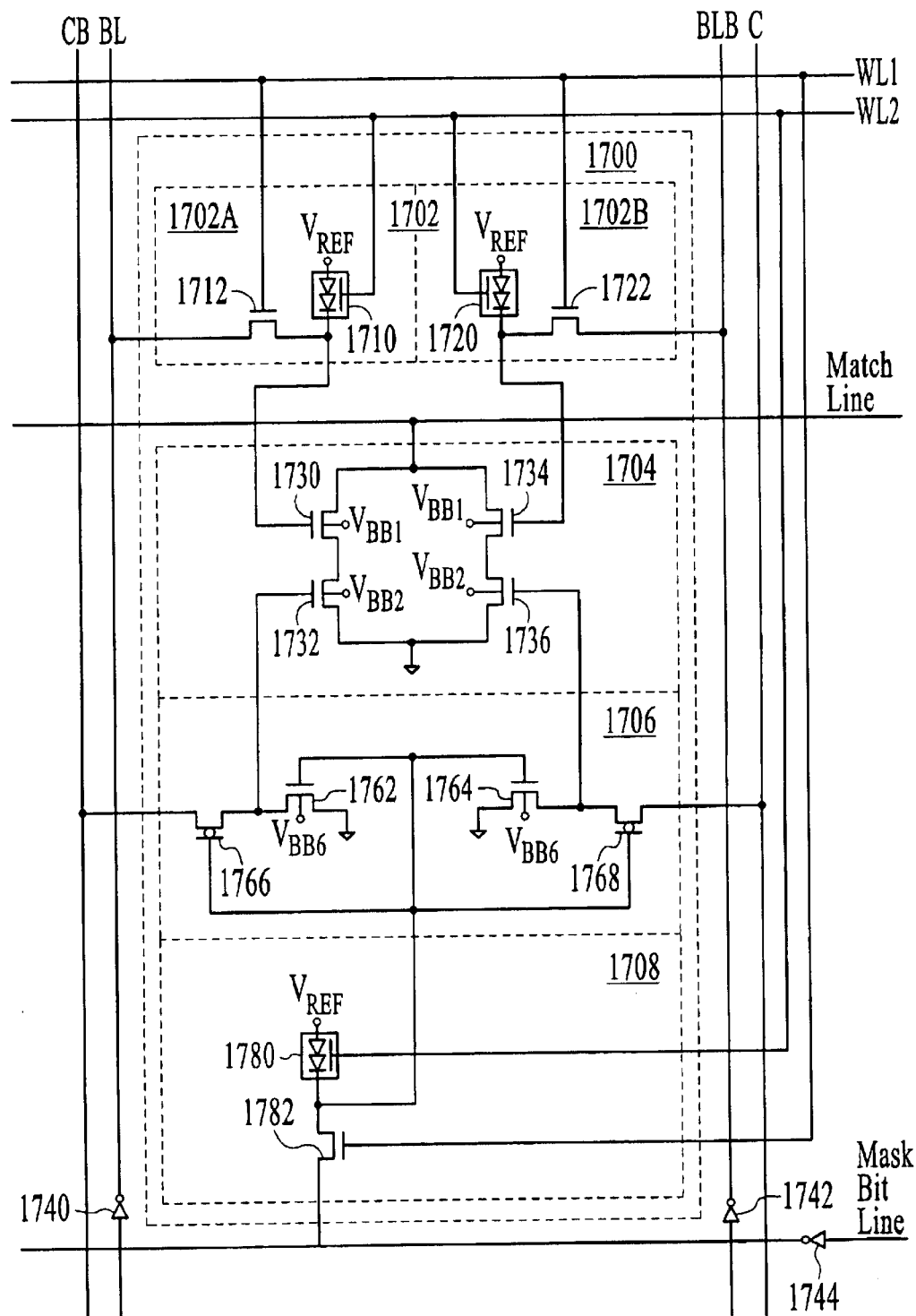
FIG. 17 is a block diagram of a ternary CAM cell that includes a thyristor-based memory cell and a thyristor-based masking cell, under an alternative embodiment of FIG. 15.

FIG. 17 is a block diagram of a ternary CAM cell 1700 that includes a thyristor-based memory cell 1702 and a thyristor-based masking cell 1708, under an alternative embodiment of FIG. 15. Memory cell 1702 is a thyristor-based memory cell including two storage devices or cells 1702A and 1702B, as described above with reference to FIG. 16. Likewise, compare circuit 1704 includes four n-channel transistors 1730, 1732, 1734, and 1736, as described above with reference to FIG. 16.

Masking cell 1708 is a storage device or cell that includes thyristor 1780 and access transistor 1782. The thyristor 1780 of an embodiment is a capacitively-coupled NDR device with a vertical-surrounding gate, as described above, and an anode coupled to a reference voltage $V_{REF}$. The access transistor 1782 couples thyristor 1780 to the mask bit line. The source (drain) of access transistor 1782 is coupled to the mask bit line, while the drain (source) of access transistor 1782 is coupled to the cathode of thyristor 1780. The gate of access transistor 1782 is coupled to word line WL1. The writing of local mask data to the masking cell 1708 is performed by charge transfer through the mask bit line and access transistor 1782 in response to the logical state of the word line WL1 in combination with charge transfer through the thyristor 1780 in response to the logical state of word line WL2. The mask bit line includes an inverter 1744, but is not so limited.

The local mask data of the masking cell 1708 controls the masking circuit 1706. Masking circuit 1706 includes n-channel transistor 1762 and p-channel transistor 1766 that determine whether comparand data or masked data is provided to the left path of the compare circuit 1704 in response to the local mask data. Transistor 1766 has the source (drain) coupled to comparand signal line CB, the drain (source) coupled to the gate of transistor 1732 of the compare circuit 1704, and the gate coupled to the masking cell 1708. Transistor 1762 has the drain (source) coupled to the gate of transistor 1732 of the compare circuit 1704, the source (drain) coupled to ground potential, and the gate coupled to the masking cell 1708.

Masking circuit 1706 further includes n-channel transistor 1764 and p-channel transistor 1768 that determine whether comparand data or masked data is provided to the right path of the compare circuit 1704 in response to the local mask data. Transistor 1768 has the source (drain) coupled to comparand signal line C, the drain (source) coupled to the gate of transistor 1736 of the compare circuit 1704, and the gate coupled to the masking cell 1708. Transistor 1764 has the drain (source) coupled to the gate of transistor 1736 of the compare circuit 1704, the source (drain) coupled to ground potential, and the gate coupled to the masking cell 1708.

As transistors 1762 and 1764 are n-channel transistors coupled to the cathode of thyristor 1780, a negative bulk bias voltage $V_{BB6}$ is applied to transistors 1762 and 1764 to increase the threshold voltage of the transistors and reduce or eliminate the chances of a false mask indication, as described above. However, alternative embodiments can use any of the methods described above to eliminate the chances of a transistor being in a "false" conducting state, when the transistor has a gate coupled to the cathode of a thyristor-based storage device.

Figure 18:
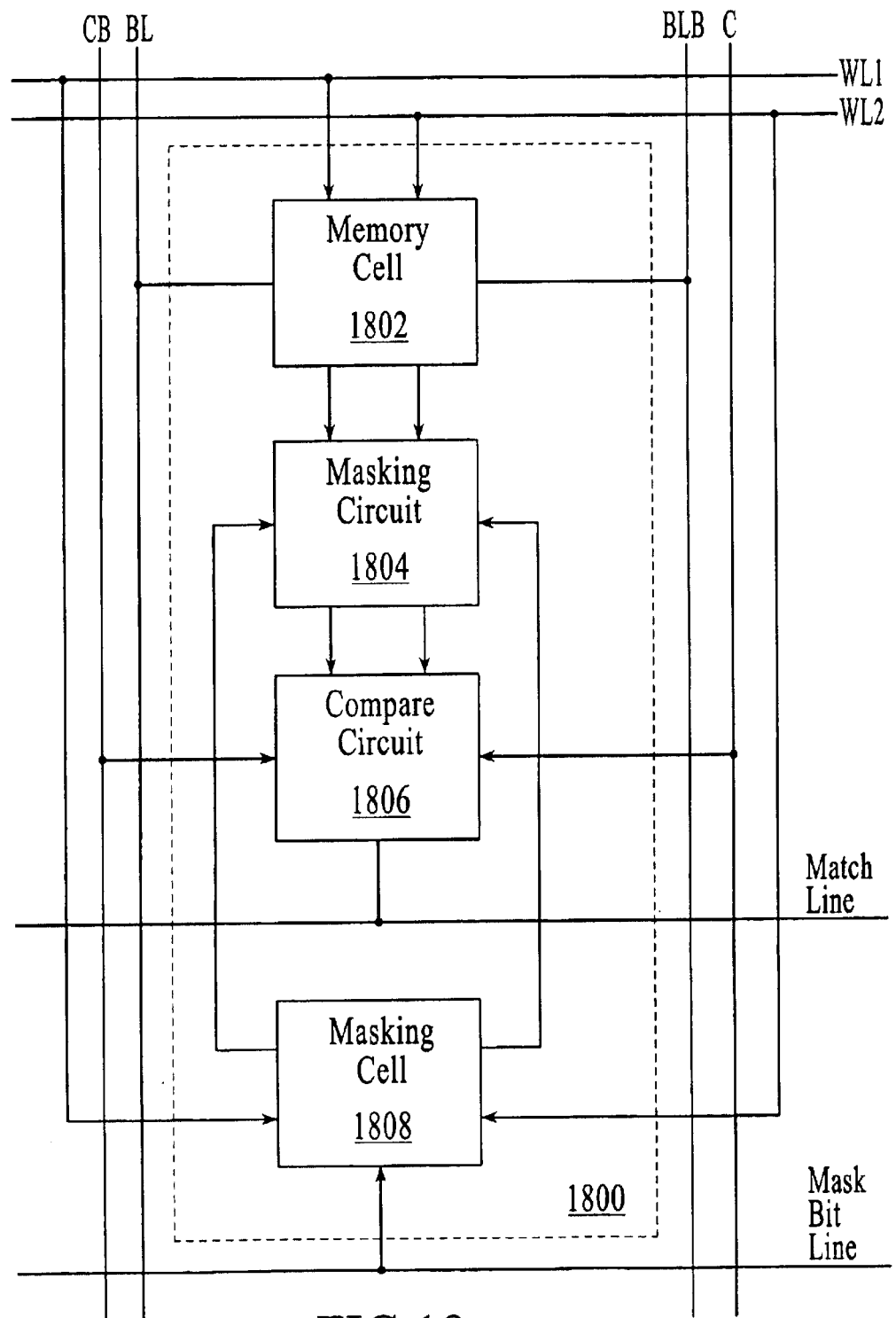
FIG. 18 is a block diagram of a ternary CAM cell that includes a thyristor-based memory cell and a masking circuit that controls masking of input data, under an alternative embodiment of FIG. 10.

Similar to the ternary CAM cell described above that masks comparand data, ternary CAM cells that mask input data also make use of the CAM cell architectures described herein. FIG. 18 is a block diagram of a ternary CAM cell 1800 that includes a thyristor-based memory cell 1802 and a masking circuit 1804 that controls masking of input data, under an alternative embodiment of FIG. 10. The ternary CAM cell 1800 also includes compare circuit 1806 and masking cell 1808, but is not so limited.

Memory cell 1802 stores data to be compared with comparand data provided on compare signal lines C and CB during a compare operation. The memory cell 1802 is a thyristor-based RAM cell, but alternative embodiments can include any number and/or type of memory storage element, including volatile or nonvolatile memory storage elements. When the memory cell 1802 is selected by a signal of the word lines, data may be read from or written to the memory cell 1802 via the bit lines. The memory cell 1802 couples to provide data stored in the memory cell 1802 to the masking circuit 1804.

The compare circuit 1806 couples to control the logic state of the match line in response to data received from the masking circuit 1804. The compare circuit 1806 compares the data received from the masking circuit 1804 with comparand data received via the compare signal lines C and CB. The compare circuit 1806 controls the logic state of the match line, and the comparison result is determined by evaluating the logic state of the match line.

The masking cell 1808 stores local mask data that indicates whether the data stored in memory cell 1802 is masked during a comparison operation. The masking cell 1808 is a thyristor-based RAM cell, but alternative embodiments can include any number and/or type of memory storage element, including volatile or nonvolatile memory storage elements. When the masking cell 1808 is selected by the appropriate word lines, masking data is read from or written to the masking cell 1808 via the mask bit line. The masking circuit 1804 receives the local mask data from the masking cell 1808 and, in response thereto, provides either data from the memory cell 1802 or masked data to compare circuit 1806.

For example, when the local mask data stored in masking cell 1808 indicates that the data in memory cell 1802 should be masked from a comparison with the comparand data, masking circuit 1804 provides masked data to compare circuit 1806 instead of the data of the memory cell 1802. In response, compare circuit 1806 controls the match line logic state so as to always provide a match indication regardless of whether the data stored in memory cell 1802 actually matches the comparand data. When the local mask data stored in the masking cell 1808 indicates that the data stored in memory cell 1802 should not be masked from a comparison with the comparand data, the masking circuit 1804 provides the data stored in memory cell 1802 to compare circuit 1806 for comparison with the comparand data.

Figure 19:
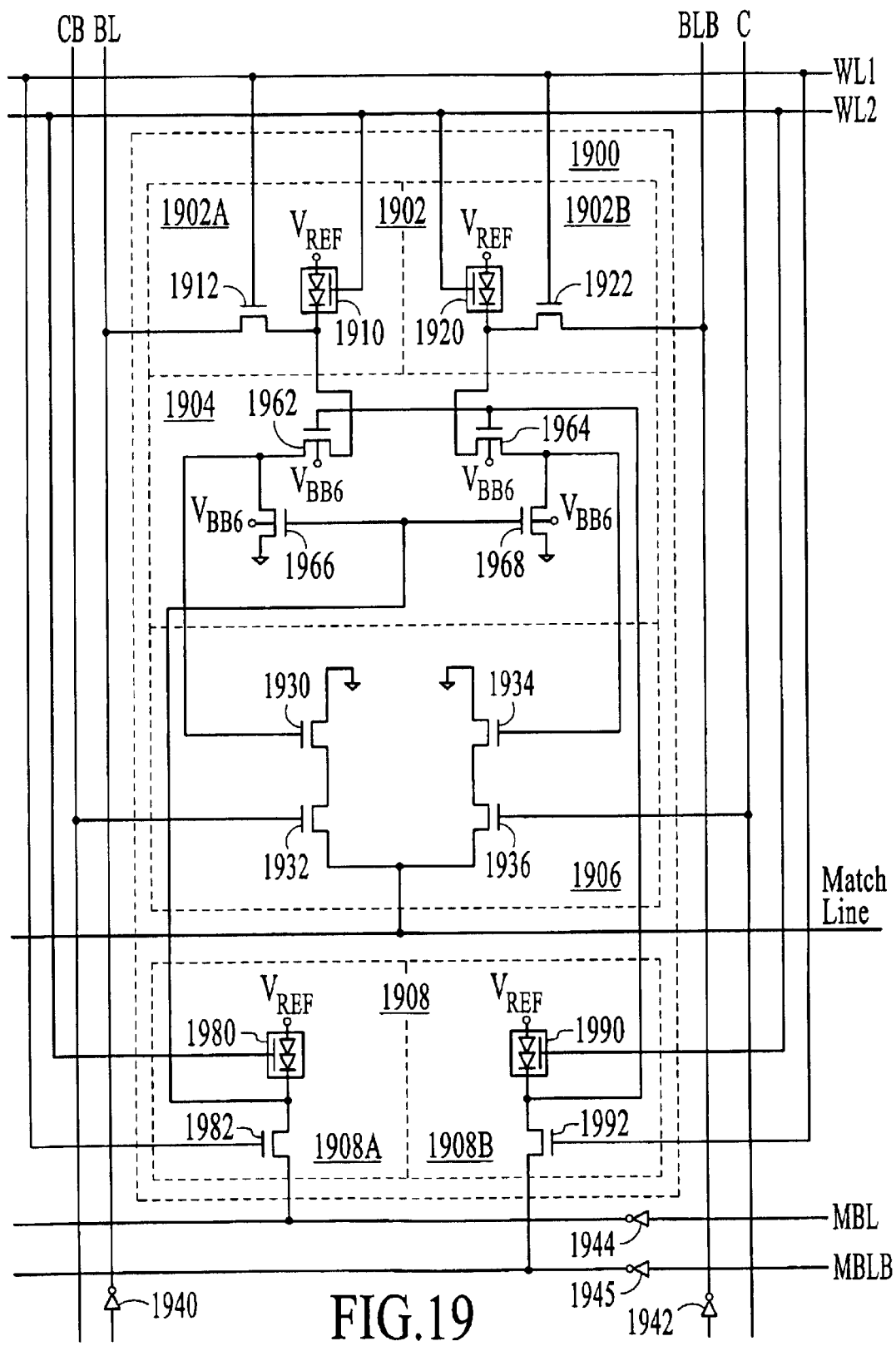
FIG. 19 is a block diagram of a ternary CAM cell that includes a thyristor-based memory cell and a thyristor-based masking cell, under the embodiment of FIG. 18.

FIG. 19 is a block diagram of a ternary CAM cell 1900 that includes a thyristor-based memory cell 1902 and a thyristor-based masking cell 1908, under the embodiment of FIG. 18. Memory cell 1902 is a thyristor-based memory cell including two SRAM storage devices or cells 1902A and 1902B, as described above with reference to FIG. 2. Likewise, compare circuit 1904 includes four n-channel transistors 1930, 1932, 1934, and 1936, as described above with reference to FIG. 2.

Masking cell 1908 is a thyristor-based memory cell including two storage devices or cells 1908A and 1908B. The first cell 1908A includes thyristor 1980 and access transistor 1982. The thyristor 1980 of an embodiment is a capacitively-coupled NDR device with a vertical-surrounding gate, as described above. The anode of thyristor 1980 is coupled to a reference voltage $V_{REF}$. The cathode of thyristor 1980 is coupled to the gate of n-channel transistors 1966 and 1968 of the masking circuit 1904, but alternative embodiments can use various other types of transistors. The surrounding gate of thyristor 1980 is coupled to word line WL2.

The access transistor 1982 couples thyristor 1980 to the mask bit line MBL. The source (drain) of access transistor 1982 is coupled to the mask bit line MBL, while the drain (source) of access transistor 1982 is coupled to the cathode of thyristor 1980. The gate of access transistor 1982 is coupled to word line WL1. The writing of data to and the reading of data from the first cell 1908A is performed by charge transfer through the mask bit line MBL and access transistor 1982 in response to the logical state of the word line WL1 in combination with charge transfer through the thyristor 1980 in response to the logical state of word line WL2. The mask bit line MBL includes an inverter 1944, but is not so limited.

The second cell 1908B includes thyristor 1990 and access transistor 1992. The anode of thyristor 1990 is coupled to a reference voltage $V_{REF}$. The cathode of thyristor 1990 is coupled to the gate of n-channel transistors 1962 and 1964 of the masking circuit 1904, but alternative embodiments can use various other types of transistors. The surrounding gate of thyristor 1990 is coupled to word line WL2.

The access transistor 1992 couples thyristor 1990 to the mask bit line MBLB. The source (drain) of access transistor 1992 is coupled to the mask bit line MBLB, while the drain (source) of access transistor 1992 is coupled to the cathode of thyristor 1990. The gate of access transistor 1992 is coupled to word line WL1. The writing of data to and the reading of data from the second cell 1908B is performed by charge transfer through the mask bit line MBLB and access transistor 1992 in response to the logical state of the word line WL1 in combination with charge transfer through the thyristor 1990 in response to the logical state of word line WL2. The mask bit line MBLB includes an inverter 1945, but is not so limited.

The local mask data of the masking cell 1908 controls the masking circuit 1904. Masking circuit 1904 includes n-channel transistors 1962 and 1966 that determine whether data or masked data is provided to the left path of the compare circuit 1906 in response to the local mask data. Transistor 1962 has the source (drain) coupled to storage device 1902A, the drain (source) coupled to the gate of transistor 1930 of the compare circuit 1906, and the gate coupled to storage device 1908B of the masking cell 1908. Transistor 1966 has the source (drain) coupled to ground potential, the drain (source) coupled to the gate of transistor 1930 of the compare circuit 1906, and the gate coupled to storage device 1908A of the masking cell 1908.

Masking circuit 1904 further includes n-channel transistors 1964 and 1968 that determine whether data or masked data is provided to the right path of the compare circuit 1906 in response to the masking data. Transistor 1964 has the source (drain) coupled to storage device 1902B, the drain (source) coupled to the gate of transistor 1934 of the compare circuit 1906, and the gate coupled to storage device 1908B of the masking cell 1908. Transistor 1968 has the source (drain) coupled to ground potential, the drain (source) coupled to the gate of transistor 1934 of the compare circuit 1906, and the gate coupled to storage device 1908A of the masking cell 1908.

As transistors 1962–1968 are n-channel transistors coupled to the cathodes of thyristors, a negative bulk bias voltage $V_{BB6}$ is applied to transistors 1962–1968 to increase the threshold voltage of the transistors and reduce or eliminate the chances of a false mask indication, as described above. However, alternative embodiments can use any of the methods described above to eliminate the chances of a transistor being in a "false" conducting state, when the transistor has a gate coupled to the cathode of a thyristor-based storage device.

Figure 20:
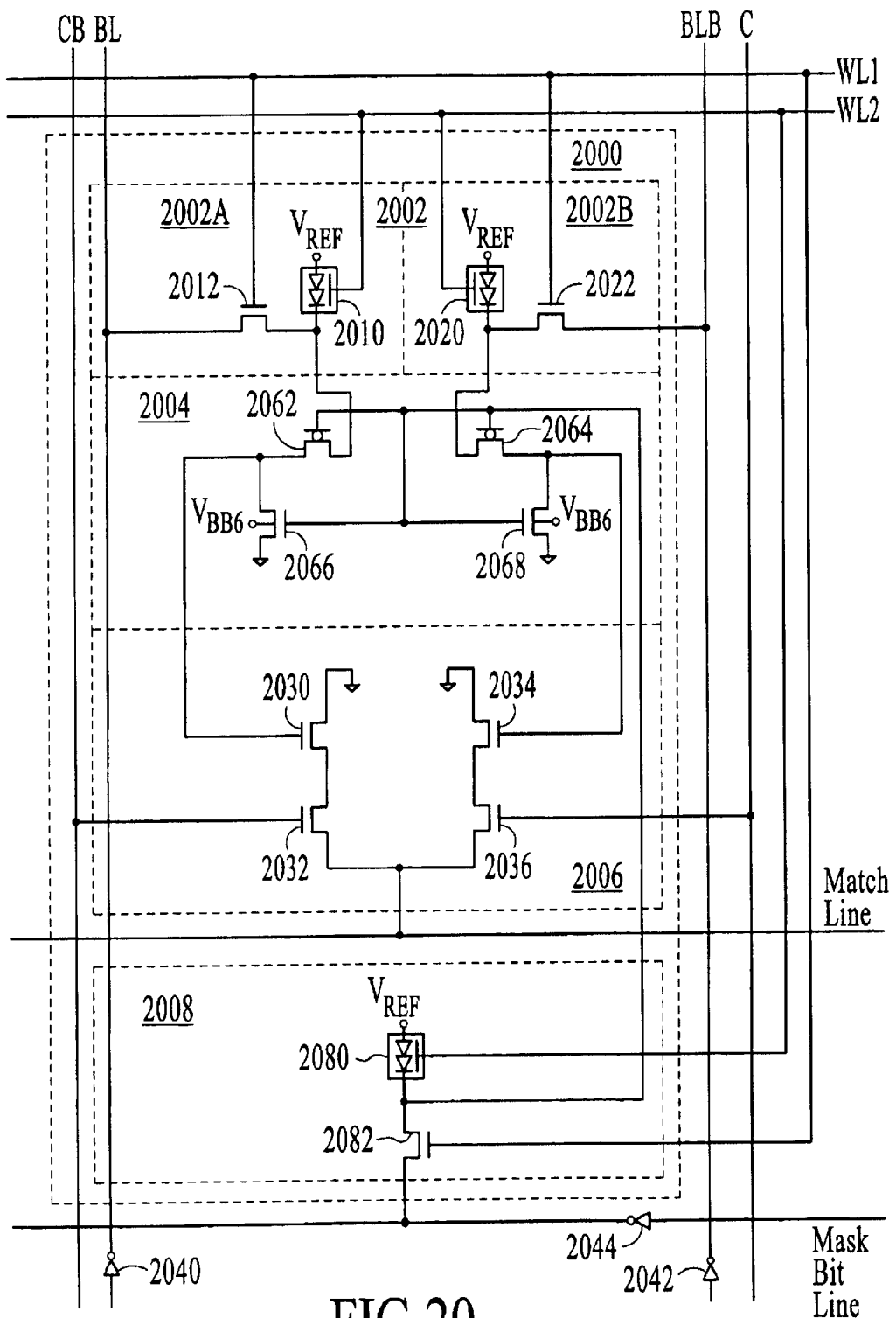
FIG. 20 is a block diagram of a ternary CAM cell that includes a thyristor-based memory cell and a thyristor-based masking cell, under an alternative embodiment of FIG. 18.

FIG. 20 is a block diagram of a ternary CAM cell 2000 that includes a thyristor-based memory cell 2002 and a thyristor-based masking cell 2008, under an alternative embodiment of FIG. 18. Memory cell 2002 is a thyristor-based memory cell including two storage devices or cells 2002A and 2002B, as described above with reference to FIG. 19. Likewise, compare circuit 2006 includes four n-channel transistors 2030, 2032, 2034, and 2036, as described above with reference to FIG. 19.

Masking cell 2008 is a thyristor-based memory cell including a thyristor 2080 and access transistor 2082. The thyristor 2080 of an embodiment is a capacitively-coupled NDR device with a vertical-surrounding gate and an anode coupled to a reference voltage $V_{REF}$. The cathode of thyristor 2080 is coupled to the gates of p-channel transistors 2062 and 2064 of the masking circuit 2004, but alternative embodiments can use various other types of transistors. The surrounding gate of thyristor 2080 is coupled to word line WL2.

The access transistor 2082 couples thyristor 2080 to the mask bit line. The source (drain) of access transistor 2082 is coupled to the mask bit line, while the drain (source) of access transistor 2082 is coupled to the cathode of thyristor 2080. The gate of access transistor 2082 is coupled to word line WL1. The writing of data to and the reading of data from the masking cell 2008 is performed by charge transfer through the mask bit line and access transistor 2082 in response to the logical state of the word line WL1 in combination with charge transfer through the thyristor 2080 in response to the logical state of word line WL2. The mask bit line includes an inverter 2044, but is not so limited.

The local mask data of the masking cell 2008 controls the masking circuit 2004. Masking circuit 2004 includes p-channel transistor 2062 and n-channel transistor 2066 that determine whether data or masked data is provided to the left path of the compare circuit 2006 in response to the local mask data. Transistor 2062 has the source (drain) coupled to storage device 2002A, the drain (source) coupled to the gate of transistor 2030 of the compare circuit 2006, and the gate coupled to the masking cell 2008. Transistor 2066 has the source (drain) coupled to ground potential, the drain (source) coupled to the gate of transistor 2030 of the compare circuit 2006, and the gate coupled to the masking cell 2008.

Masking circuit 2004 further includes p-channel transistor 2064 and n-channel transistor 2068 that determine whether data or masked data is provided to the right path of the compare circuit 2006 in response to the masking data. Transistor 2064 has the source (drain) coupled to storage device 2002B, the drain (source) coupled to the gate of transistor 2034 of the compare circuit 2006, and the gate coupled to the masking cell 2008. Transistor 2068 has the source (drain) coupled to ground potential, the drain (source) coupled to the gate of transistor 2034 of the compare circuit 2006, and the gate coupled to the masking cell 2008. As transistors 2066 and 2068 are n-channel transistors coupled to the cathodes of thyristors, a negative bulk bias voltage $V_{BB6}$ is applied to transistors 2066 and 2068 to increase the threshold voltage of the transistors and reduce or eliminate the chances of a false mask indication, as described above. However, alternative embodiments can use any of the methods described above to eliminate the chances of a transistor being in a "false" conducting state, when the transistor has a gate coupled to the cathode of a thyristor-based storage device.

Further alternatives to the binary and ternary CAM cells described above include binary and ternary single- and multi-compare CAM cells having memory cells for data storage under a variety of embodiments supported within the scope of the embodiments described above. For example, various embodiments can include single- and/or double-storage device memory cells in various combinations with compare circuits that include single-compare XY compare circuits, multi-compare XY compare circuits, and simultaneous multi-compare XY circuits, to name a few, but the alternatives are not so limited.

Figure 21:
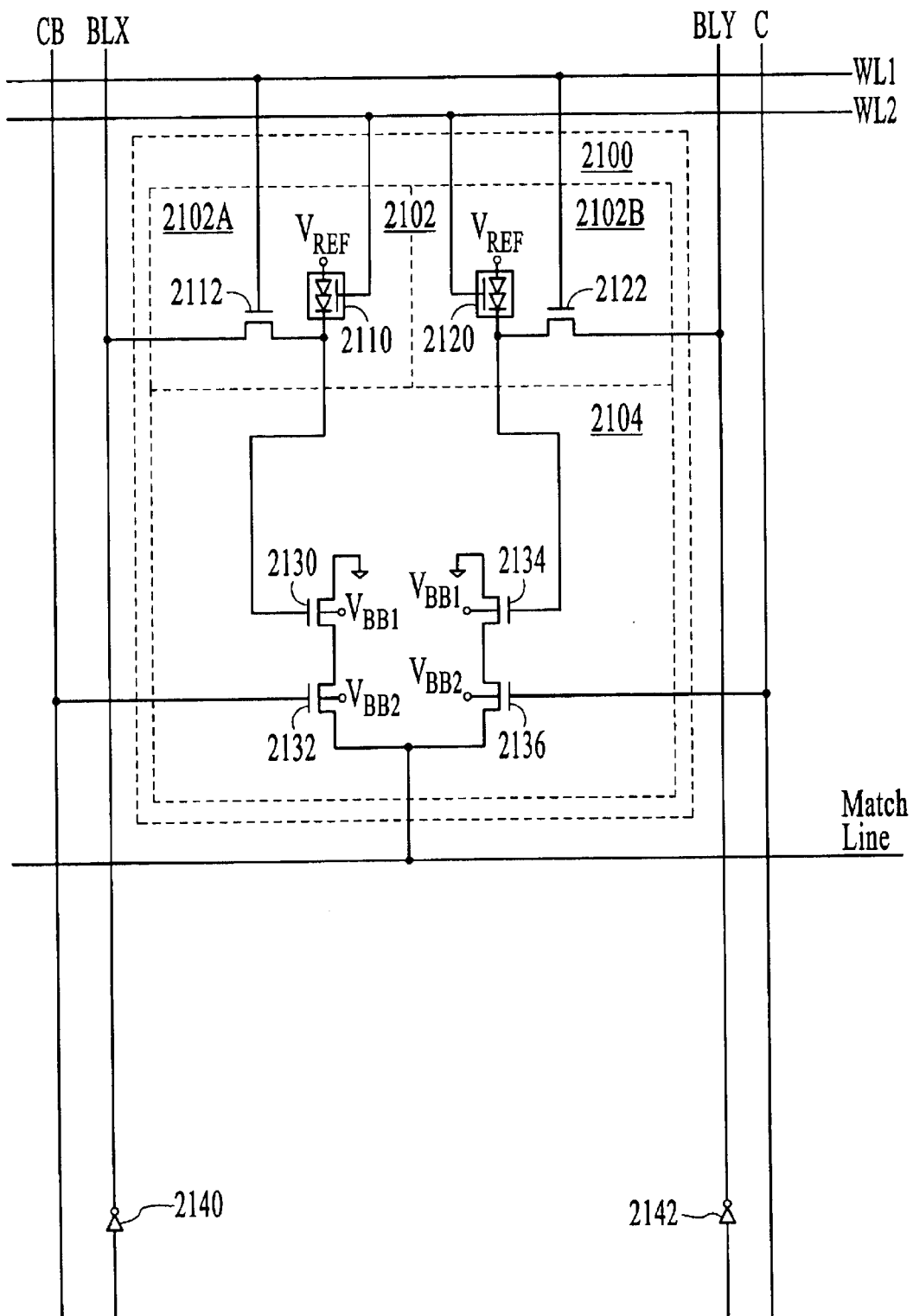
FIG. 21 is a block diagram of a CAM cell that includes a thyristor-based memory cell and a single-compare XY compare circuit, under an embodiment.

FIG. 21 is a block diagram of a CAM cell 2100 that includes a thyristor-based memory cell 2102 and a single-compare XY compare circuit 2104, under an embodiment. Compare circuit 2104 includes four n-channel transistors 2130, 2132, 2134, and 2136, as described above with reference to FIG. 2.

Memory cell 2102 is a thyristor-based memory cell including two storage devices or cells 2102A and 2102B. The first cell 2102A includes thyristor 2110 and access transistor 2112. The thyristor 2110 of an embodiment is a capacitively-coupled NDR device with a vertical-surrounding gate and an anode that is coupled to a reference voltage $V_{REF}$. The cathode of thyristor 2110 is coupled to the gate of n-channel transistor 2130 of the compare circuit 2104, but alternative embodiments can use various other types of transistors. The surrounding gate of thyristor 2110 is coupled to word line WL2.

The access transistor 2112 couples thyristor 2110 to data bit line BLX. The source (drain) of access transistor 2112 is coupled to data bit line BLX, while the drain (source) of access transistor 2112 is coupled to the cathode of thyristor 2110. The gate of access transistor 2112 is coupled to word line WL1. The writing of data to and the reading of data from the first cell 2102A is performed by charge transfer through the bit line BLX and access transistor 2112 in response to the logical state of the word line WL1 in combination with charge transfer through the thyristor 2110 in response to the logical state of word line WL2, as described further below. The data bit line BLX includes an inverter 2140, but is not so limited.

The second cell 2102B includes thyristor 2120 and access transistor 2122. The thyristor 2120 of an embodiment is a capacitively-coupled NDR device with a vertical-surrounding gate, and an anode that is coupled to a reference voltage $V_{REF}$. The cathode of thyristor 2120 is coupled to the gate of n-channel transistor 2134 of the compare circuit 2104, but alternative embodiments can use various other types of transistors. The surrounding gate of thyristor 2120 is coupled to word line WL2.

The access transistor 2122 couples thyristor 2120 to data bit line BLY. The source (drain) of access transistor 2122 is coupled to data bit line BLY, while the drain (source) of access transistor 2122 is coupled to the cathode of thyristor 2120. The gate of access transistor 2122 is coupled to word line WL1. The writing of data to and the reading of data from the second cell 2102B is performed by charge transfer through the bit line BLY and access transistor 2122 in response to the logical state of the word line WL1 in combination with charge transfer through the thyristor 2120 in response to the logical state of word line WL2. The data bit line BLY includes an inverter 2142, but is not so limited.

Compare circuit 2104 compares the data stored in the memory cell 2102 with comparand data provided on compare signal lines C and CB. Compare circuit 2104 pulls the pre-charged match line to a logic zero state when the comparand data does not match (i.e., mismatches) the data stored in the memory cell 2102, but the embodiment is not so limited.

Note that CAM cell 2100 is in one embodiment a binary CAM cell and in another embodiment a quaternary CAM cell. A quaternary CAM cell is one that is effectively able to store four states of information: a logic one state, a logic zero state, a forced-match state (i.e., a local mask), and a forced-mismatch state. If cell 2102A stores data X and cell 2102B stores data Y, then the truth table of Table 2 summarizes the four states.

TABLE 2

| X | Y | State |
|---|---|---|
| 0 | 0 | Forced-match |
| 0 | 1 | 0 |
| 1 | 0 | 1 |
| 1 | 1 | Forced-mismatch |

Note that in the forced-mismatch state both X and Y are logic high such that transistors 2130 and 2134 are on. During a compare operation, one of CB or C will be logic high, thus discharging the match line to indicate a mismatch state.

Figure 22:
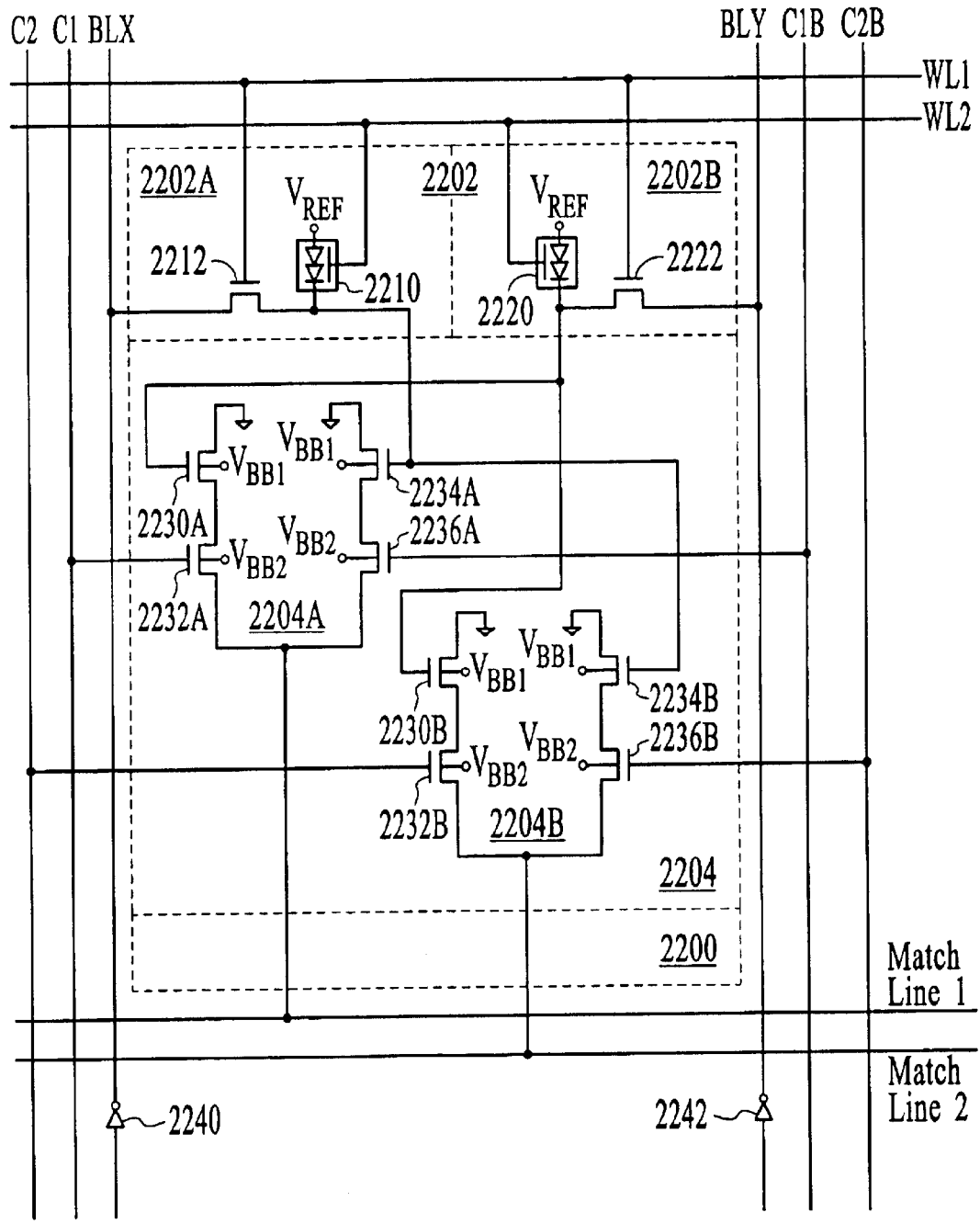
FIG. 22 is a block diagram of a CAM cell that includes a thyristor-based memory cell and a multi-compare XY compare circuit, under an embodiment.

FIG. 22 is a block diagram of a CAM cell 2200 that includes a thyristor-based memory cell 2202 and a multi-compare XY compare circuit 2204, under an embodiment. Memory cell 2202 is a thyristor-based memory cell including two storage devices or cells 2202A and 2202B, as described above with reference to FIG. 21.

Compare circuit 2204 includes two compare circuits 2204A and 2204B. Circuit 2204A compares data stored in the memory cell 2202 with comparand data provided on compare signal lines C1 and 1B. Circuit 2204B compares data stored in the memory cell 2202 with comparand data provided on compare signal lines C2 and C2B.

Compare circuit 2204A includes transistors 2230A, 2232A, 2234A, and 2236A coupled to perform the comparison function. In the compare circuit 2204A of an embodiment, transistors 2230A, 2232A, 2234A, and 2236A are n-channel transistors, but the embodiment is not so limited. Transistors 2230A and 2232A are coupled in series to form a first path of the compare circuit 2204A, and transistors 2234A and 2236A are coupled in series to form a second path of the compare circuit.

Regarding control inputs to the transistors of the compare circuit 2204A, the gate of transistor 2230A is coupled to received data from cell 2202B, and the gate of transistor 2234A is coupled to receive data from cell 2202A. The gate of transistor 2232A receives comparand data from compare signal line C1 and the gate of transistor 2236A receives comparand data from compare signal line C1B. The sources (drains) of transistors 2232A and 2236A are coupled to match line 1, while the drains (sources) of transistors 2230A and 2234A are coupled to ground potential. Compare circuit 2204A pulls match line 1 to a logic zero state when the comparand data matches the data stored in the memory cell 2202.

Compare circuit 2204B includes transistors 2230B, 2232B, 2234B, and 2236B coupled to perform the comparison function. In the compare circuit 2204B of an embodiment, transistors 2230B, 2232B, 2234B, and 2236B are n-channel transistors, but the embodiment is not so limited. Transistors 2230B and 2232B are coupled in series to form a first path of the compare circuit 2204B, and transistors 2234B and 2236B are coupled in series to form a second path of the compare circuit.

Regarding control inputs to the transistors of the compare circuit 2204B, the gate of transistor 2230B is coupled to received data from cell 2202B, and the gate of transistor 2234B is coupled to receive data from cell 2202A. The gate of transistor 22323 receives comparand data from compare signal line C2 and the gate of transistor 2236B receives comparand data from compare signal line C2B. The sources (drains) of transistors 2232B and 2236B are coupled to match line 2, while the drains (sources) of transistors 2230B and 2234B are coupled to ground potential. Compare circuit 2204B pulls match line 2 to a logic zero state when the comparand data matches the data stored in the memory cell 2202.

Note that CAM cell 2200 is, in one embodiment, effectively two binary CAM cells; the first including memory cell 2202A and compare circuit 2204A, and the second including memory cell 2202B and compare circuit 2204B. Each of these two CAM cells is able to independently and simultaneously (i.e., overlapping at least at one point in time) compare stored data with corresponding independent compare data on the compare signal lines, and the match results will be reflected on match lines 1 and 2. Alternatively, the compare operations can be pipelined.

For another embodiment, CAM cell 2200 is a quaternary CAM cell that includes multi-compare functionality to perform multiple independent simultaneous (or pipelined) compare operations.

Figure 23:
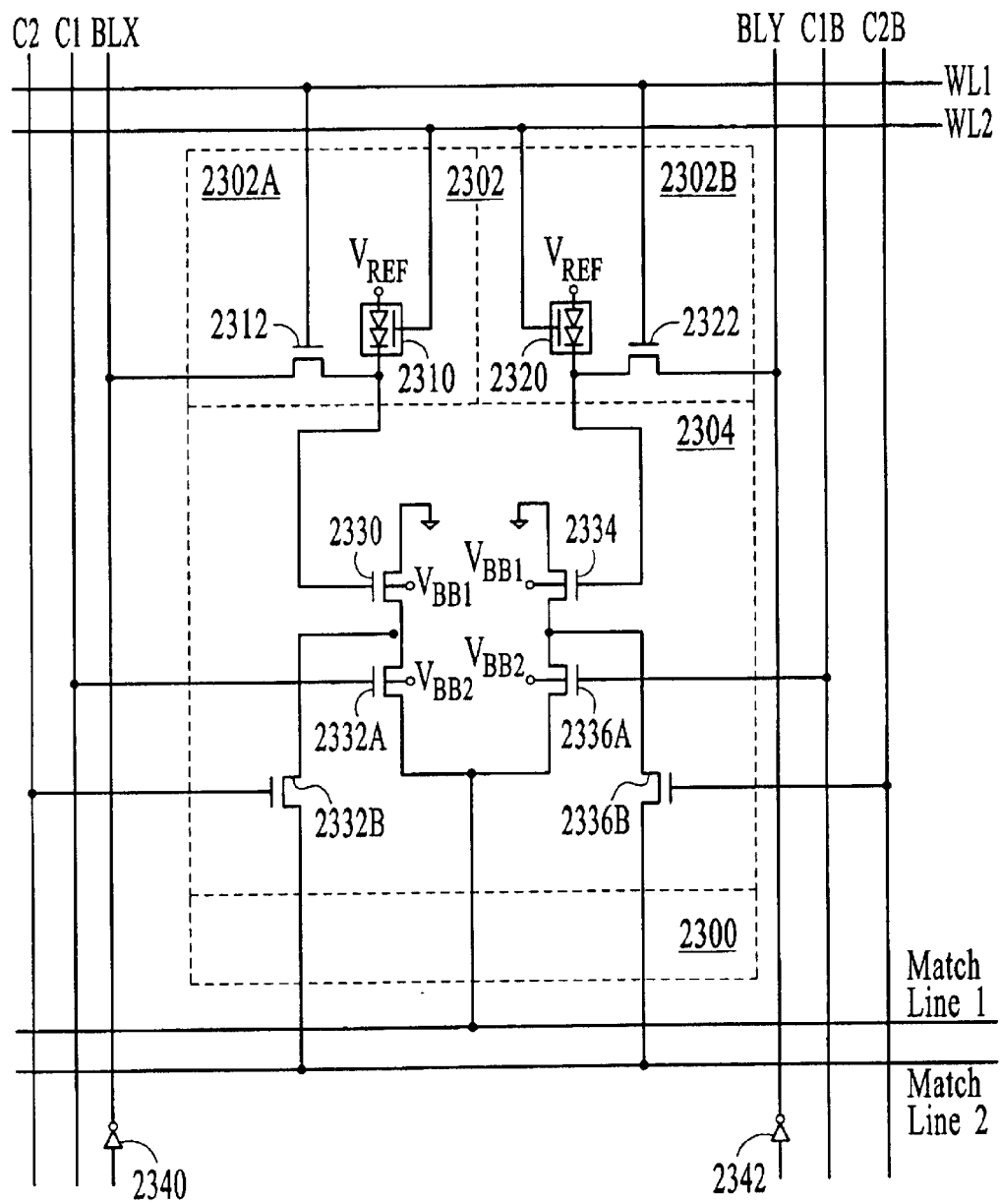
FIG. 23 is a block diagram of a binary CAM cell that includes a thyristor-based memory cell and a multi-compare XY compare circuit, under an alternative embodiment of FIG. 22.

FIG. 23 is a block diagram of a binary CAM cell 2300 that includes a thyristor-based memory cell 2302 and a multi-compare XY compare circuit 2304, under an alternative embodiment of FIG. 22. Memory cell 2302 is a thyristor-based memory cell including two storage devices or cells 2302A and 2302B, as described above with reference to FIG. 22.

Compare circuit 2304 compares data stored in the memory cell 2302 with comparand data provided on compare signal lines C1 and C1B, and alternatively compares data stored in the memory cell 2302 with comparand data provided on compare signal lines C2 and C2B.

Compare circuit 2304 includes transistors 2330, 2332A, 2332B, 2334, 2336A, and 2336B coupled to perform the comparison function. In the compare circuit of an embodiment, all transistors of the compare circuit are n-channel transistors, but the embodiment is not so limited. Transistors 2330 and 2332A are coupled in series to form a first path through the compare circuit 2304 between match line 1 and ground potential. Transistors 2334 and 2336A are coupled in series to form a second path through the compare circuit 2304 between match line 1 and ground potential.

Furthermore, transistors 2330 and 2332B are coupled in series to form a first path through the compare circuit 2304 between match line 2 and ground potential. Moreover, transistors 2334 and 2336B are coupled in series to form a second path through the compare circuit 2304 between match line 2 and ground potential.

Regarding control inputs to the transistors forming paths between match line 1 and ground potential, the gate of transistor 2330 is coupled to received data from cell 2302A, and the gate of transistor 2334 is coupled to receive data from cell 2302B. The gate of transistor 2332A receives comparand data from compare signal line C1 and the gate of transistor 2336A receives comparand data from compare signal line C1B. The sources (drains) of transistors 2332A and 2336A are coupled to match line 1, while the drains (sources) of transistors 2330 and 2334 are coupled to ground potential. The compare circuit 2304 pulls match line 1 to a logic zero state when the comparand data on compare signal lines C1 and C1B matches the data stored in the memo ry cell 2302.

Regarding control inputs to the transistors forming paths between match line 2 and ground potential, the gate of transistor 2330 is coupled to received data from cell 2302A, and the gate of transistor 2334 is coupled to receive data from cell 2302B. The gate of transistor 2332B receives comparand data from compare signal line C2 and the gate of transistor 2336B receives comparand data from compare signal line C2B. The sources (drains) of transistors 2332B and 2336B are coupled to match line 2, while the drains (sources) of transistors 2330 and 2334 are coupled to ground potential. The compare circuit 2304 pulls match line 2 to a logic zero state when the comparand data on compare signal lines C2 and C2B matches the data stored in the memory cell 2302.

Figure 24:
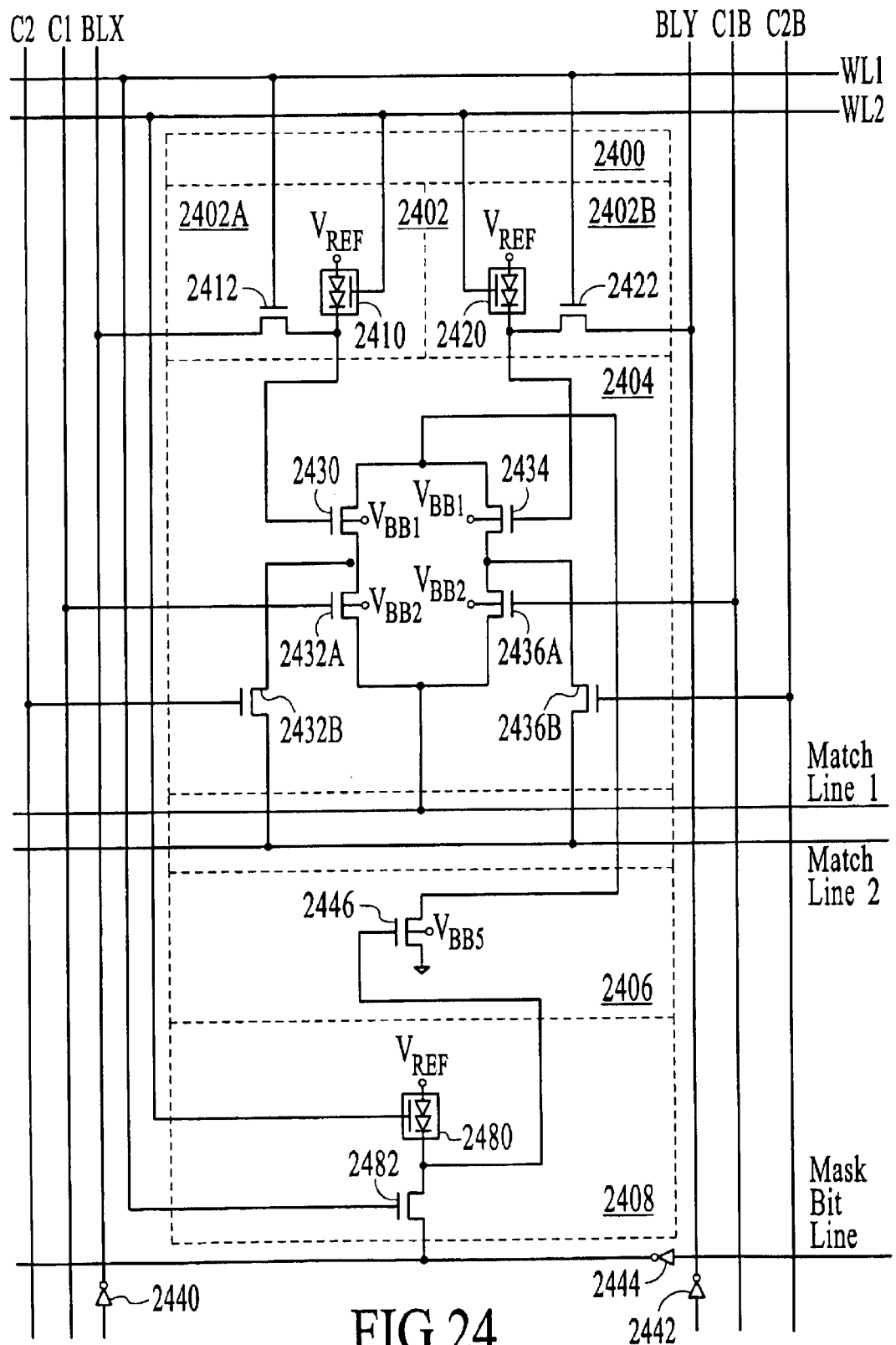
FIG. 24 is a block diagram of a ternary CAM cell that includes a thyristor-based memory cell and a multi-compare XY compare circuit, under an embodiment.

FIG. 24 is a block diagram of a ternary CAM cell 2400 that includes a thyristor-based memory cell 2402, a multi-compare XY compare circuit 2404, and a thyristor-based masking cell 2408, under an embodiment. Memory cell 2402 is a thyristor-based memory cell including two storage devices or cells 2402A and 2402R, as described above with reference to FIG. 22. Also, compare circuit 2404 includes transistors 2430, 2432A, 2432B, 2434, 2436A, and 2436B coupled to perform the comparison function, as described above with reference to FIG. 23. Furthermore, masking cell 2408 is a storage device or cell that includes thyristor 2480 and access transistor 2482, as described above with reference to FIG. 11.

Masking circuit 2406 includes a mask control transistor 2446. The source (drain) of mask control transistor 2446 is coupled to the drains (sources) of n-channel transistors 2430 and 2434 of compare circuit 2404. The drain (source) of mask control transistor 2446 is coupled to ground potential. Mask control transistor 2446 is an n-channel transistor coupled to the cathode of thyristor 2480 and, as such, includes a negative bulk bias voltage $V_{BB5}$ to increase the threshold voltage of the transistor 2446 and reduce or eliminate the chances of a false non-mask condition, as described above with reference to the false mismatch indication. However, alternative embodiments can use any of the methods described above to eliminate the chances of a transistor being in a "false" conducting state, when the transistor has a gate coupled to the cathode of a thyristor-based storage device.

Local mask data of the masking cell 2408 controls the gate, and thus the conducting state, of mask control transistor 2446. When the local mask data is a logic one indicating a non-mask condition, mask control transistor 2446 is conducting or "on" such that the compare results generated by compare circuit 2404 control the logical state of match lines 1 and 2 via the coupled path to ground potential. When, however, the local mask data is a logic zero indicating a mask condition, mask control transistor 2446 is non-conducting or "off" such that the compare results generated by compare circuit 2404 do not affect the logical state of match lines 1 and 2 because of the absence of a discharge path to ground potential.

The underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc. Furthermore, aspects of the invention may be implemented as functionality programmed into any of a variety of circuitry, including programmable logic devices (PLDs), such as field programmable gate arrays (FPGAs), programmable array logic (PAL) devices, electrically programmable logic, as well as application specific integrated circuits (ASICs).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, shall refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. The teachings of the invention provided herein can be applied to other memory devices and systems, not only for the CAM cells described above.

The elements and acts of the various embodiments described above can be combined by one skilled in the art using the descriptions herein to provide further embodiments. These and other changes can be made to the invention in light of the above detailed description.

In general, in the following claims, the terms used should not be construed to limit the invention to the specific embodiments disclosed in the specification and the claims, but should be construed to include all memory-based systems that operate under the claims. Accordingly, the invention is not limited by the disclosure, but instead the scope of the invention is to be determined entirely by the claims.

While certain aspects of the invention are presented below in certain claim forms, the inventor contemplates the various aspects of the invention in any number of claim forms. Accordingly, the inventors reserve the right to add additional claims after filing the application to pursue such additional claim forms for other aspects of the invention.

I claim:

1. A content addressable memory (CAM) cell comprising:
a memory cell for storing a data value, the memory cell including at least one vertical thyristor with a surrounding gate, the vertical thyristor coupled to an access transistor; and
at least one compare circuit coupled among the memory cell and at least one match line to receive first and second signal sets and affect a logical state of the match line in response to a predetermined logical relationship between the first and second signal sets, the compare circuit including a first transistor set and a second transistor set, wherein the first signal set couples to control a conduction state of the first transistor set and the second signal set couples to control a conduction state of the second transistor set, wherein at least one transistor of the first transistor set has an offset difference between a threshold voltage and a voltage of the first signal set relative to transistors of the second transistor set.

2. The CAM cell of claim 1, wherein the first signal set includes data.

3. The CAM cell of claim 1, wherein the second signal set includes comparand data.

4. The CAM cell of claim 1, wherein the offset difference is provided by increasing a threshold voltage of the transistor of the first transistor set by biasing a substrate of the transistor at a first substrate bias potential that is less than ground potential.

5. The CAM cell of claim 4, wherein transistors of the second transistor set have a second substrate bias potential that is equal to or less than ground potential.

6. The CAM cell of claim 1, wherein the offset difference is provided by lowering a voltage of the first signal set delivered to a gate of the transistor by coupling at least one pass transistor between the memory cell and at least one transistor of the first transistor set, wherein a gate of the pass transistor couples to a source of the pass transistor.

7. The CAM cell of claim 1, wherein the offset difference is provided by increasing the threshold voltage of the transistor of the first transistor set using a gate-to-source bias voltage, wherein a source of the transistor of the first transistor set is coupled to a first voltage source having a voltage corresponding to a holding current of the memory cell, wherein the match line is pre-charged to a level approximately equal to a sum of a first potential level and the voltage source.

8. The CAM cell of claim 1, wherein the access transistor has a third substrate bias potential that is equal to or less than ground potential, wherein the third substrate bias potential controls a holding current of the access transistor.

9. The CAM cell of claim 1, wherein the first transistor set includes first and second n-channel transistors coupled for conduction state control by the first signal set.

10. The CAM cell of claim 9, wherein the memory cell includes a first thyristor-based storage element coupled to the first transistor and a second thyristor-based storage element coupled to the second transistor.

11. The CAM cell of claim 1, wherein the first transistor set includes an n-channel transistor and a p-channel transistor coupled for conduction state control by the first signal set, the n-channel transistor having a first substrate bias voltage.

12. The CAM cell of claim 11, wherein the memory cell includes a thyristor-based storage element coupled to the first and second transistors.

13. The CAM cell of claim 1, wherein the surrounding-gate thyristor includes:
anode and cathode end portions, each end portion including an emitter region and an adjacent base region;
a capacitively-coupled port that is controlled to switch the thyristor between on and off states for write access; and
a current-shunt region adapted to shunt low-level current at the base region of at least one of the end portions and inhibit the thyristor device from switching inadvertently from an off state to an on state.

14. The CAM cell of claim 1, further comprising a masking circuit coupled to the at least one compare circuit and coupled to receive at least one local mask value stored in a masking cell.

15. The CAM cell of claim 14, wherein the masking cell comprises at least one memory cell for storing the local mask value, the memory cell including a surrounding-gate thyristor coupled to an access transistor.

16. The CAM cell of claim 15, wherein a masking transistor of the masking circuit has an offset difference between a threshold voltage and a voltage corresponding to the local mask value, wherein the offset difference is provided by at least one of increasing a threshold voltage of the masking transistor by biasing a substrate of the masking transistor using a first substrate bias voltage that is less than ground potential, lowering a voltage delivered to a gate of the masking transistor by coupling at least one pass transistor between the masking cell and the masking transistor, and increasing the threshold voltage of the masking transistor using a gate-to-source bias voltage.

17. The CAM cell of claim 14, further comprising a mask bit line coupled to the marking cell over which the mask value is written to and read from the masking cell.

18. The CAM cell of claim 14, wherein the masking circuit receives comparand data and provides the comparand data to the compare circuit as the second signal set in response to the comparand data and the mask value being in a predetermined logical relationship.

19. The CAM cell of claim 1, wherein the masking circuit receives the data value from the memory cell and couples the data value to the compare circuit as the first signal set in so to the data value and the mask value being in a predetermined logical relationship, wherein the second signal set includes comparand data, wherein the first and second substrate bias voltages are approximately ground potential.

20. The CAM cell of claim 1, further comprising a first word line coupled to a gate of the access transistor, and a second word line coupled to the surrounding-gate thyristor.

21. The CAM cell of claim 1, further comprising at least one bit line coupled to the access transistor over which a data value is written to and read from the memory cell.

22. The CAM cell of claim 1, wherein the at least one memory cell includes first and second surrounding-gate thyristors and the first transistor set includes first and second transistors, the first surrounding-gate thyristor coupled among a first bit line and the first transistor and the second surrounding-gate thyristor coupled among a second bit line and the second transistor, wherein the first and second transistors use the first substrate bias voltage.

23. The CAM cell of claim 1, wherein the memory cell includes first and second surrounding-gate thyristors and the first transistor set includes first and second transistors using the first substrate bias voltage, wherein the at least one compare circuit includes first and second compare circuits each coupled to first and second match lines, wherein the first surrounding-gate thyristor is coupled among a first bit line and the first transistor of the first and second compare circuits, wherein the second surrounding-gate thyristor is coupled among a second bit line and the second transistor of the fast and second compare circuits.

24. The CAM cell of claim 1, further comprising a pre-charge circuit coupled to the match line to preset a logical state of the match line.

25. The CAM cell of claim 1, further comprising a sense amplifier coupled to the match line to detect two or more logical states of the match line.

26. A method of operating a content addressable memory (CAM) device, comprising:

setting the logical state of a match line at a first potential value;

controlling a conduction state of a fist transistor in at least one match line coupling to a node having a second potential value in response to received data;

controlling a difference between a voltage of the received data and a told voltage of the first transistor when the first transistor is an n-channel transistor coupled to a data storage element that includes a vertical thyristor with a surrounding gate;

controlling a conduction state of a second transistor in the at least one match line coupling to the node in response to received comparand data; and controlling the logical state of the match line between the first and second potential values in response to the conduction states of the first and second transistors in the two match line couplings as determined by a predetermined logical relationship between the received data and comparand data.

27. The method of claim 26, wherein controlling the difference includes increasing a threshold voltage of the first transistor by biasing a substrate of the first transistor at a first substrate bias potential that is lower than a substrate bias potential of the second transistor.

28. The method of claim 26, wherein controlling the difference includes lowering the voltage of the received data by routing the received data to a gate of the first transistor via a pass transistor, wherein a gate of the pass transistor is coupled to a source of the pass transistor.

29. The method of claim 26, wherein controlling the difference includes increasing a threshold voltage of the first transistor by coupling a source of the first transistor to a first voltage source that has a voltage corresponding to a holding current of a CAM cell of the CAM device.

30. A content addressable memory (CAM) cell comprising:

means for storing a data value, the means for storing including at least one vertical thyristor with a surrounding gate, the vertical thyristor coupled to an access transistor; and means for comparing coupled among the means for storing and at least one match line to receive first and second signal sets and affect a logical state of the match line in response to a predetermined logical relationship between the first and second signal sets, the means for comparing including a first transistor set and a second transistor set, wherein the first signal set couples to control a conduction state of the first transistor set and the second signal set couples to control a conduction state of the second transistor set, wherein at least one transistor of the first transistor set has an offset difference between a threshold voltage and a voltage of the first signal set relative to transistors of the second transistor set.

31. The CAM cell of claim 1, wherein n-channel transistors having gates coupled to the vertical thyristor have at least one of an offset threshold voltage and an offset gate voltage.

32. The CAM cell of claim 31, wherein the offset threshold voltage includes at least one of increasing a threshold voltage of the n-channel transistor by biasing a substrate of the n-channel transistor using a first substrate bias voltage that is less than ground potential and increasing the threshold voltage of the n-channel transistor using a gate-to-source bias voltage.

33. The CAM cell of claim 31, wherein the offset gate voltage includes lowering a voltage of the signals representative of the data value by coupling at least one pass transistor between the vertical thyristor and a gate of the n-channel transistor.

34. A method of operating a content addressable memory (CAM) cell comprising:

writing data to a memory cell that includes a vertical thyristor with a surrounding gate;

comparing comparand data with the memory cell data using a compare circuit to generate a comparison result, the comparison including affecting a potential of a match line via charge control paths in response to a logical relationship between the memory cell data and the comparand data;

controlling an offset between a voltage associated with the data and a threshold voltage of at least one transistor of the charge control paths when the transistor is coupled to the vertical thyristor, wherein offset control comprises at least one of increasing the threshold voltage of the transistor by biasing the transistor substrate at a substrate bias potential that is lower than a substrate bias potential of other transistors of the charge control paths that receive comparand data, lowering a voltage delivered to a gate of the transistor by routing the data to the gate via a pass transistor, wherein a gate of the pass transistor is coupled to a source of the pass transistor, and increasing the threshold voltage of the transistor using a gate-to-source bias voltage.

35. The method of claim 34, wherein the gate-to-source bias voltage is provided by coupling a source of the transistor to a voltage source that has a voltage corresponding to a holding current of the memory cell.

* * * * *